US009224784B2

(12) United States Patent
Kim et al.

(10) Patent No.: US 9,224,784 B2
(45) Date of Patent: Dec. 29, 2015

(54) NON-VOLATILE MEMORY DEVICES AND METHODS OF FABRICATING THE SAME

(71) Applicants: Whan-Kyun Kim, Seoul (KR); Young-Hyun Kim, Seoul (KR); Woo-Jin Kim, Yongin-si (KR)

(72) Inventors: Whan-Kyun Kim, Seoul (KR); Young-Hyun Kim, Seoul (KR); Woo-Jin Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 50 days.

(21) Appl. No.: 14/195,891

(22) Filed: Mar. 4, 2014

(65) Prior Publication Data

US 2014/0264680 A1 Sep. 18, 2014

(30) Foreign Application Priority Data

Mar. 12, 2013 (KR) .................. 10-2013-0026250

(51) Int. Cl.
*H01L 27/22* (2006.01)
*H01L 43/08* (2006.01)

(52) U.S. Cl.
CPC ............ *H01L 27/222* (2013.01); *H01L 27/228* (2013.01); *H01L 43/08* (2013.01)

(58) Field of Classification Search
CPC ..... H01L 27/222; H01L 27/228; H01L 43/08; H01L 43/12
USPC .......... 257/427, E21.665, E43.001; 438/253, 438/254, 396
See application file for complete search history.

(56) References Cited

U.S. PATENT DOCUMENTS

| 6,783,994 | B2 | 8/2004 | Rizzo et al. | |
|---|---|---|---|---|
| 6,887,719 | B2 | 5/2005 | Lu et al. | |
| 6,992,342 | B2 | 1/2006 | Motoyoshi et al. | |
| 7,885,105 | B2 | 2/2011 | Li et al. | |
| 8,129,806 | B2 | 3/2012 | Nam et al. | |
| 2006/0228853 | A1* | 10/2006 | Jeong et al. | 438/238 |
| 2007/0170484 | A1* | 7/2007 | Horii | 257/296 |
| 2009/0261433 | A1 | 10/2009 | Kang et al. | |
| 2010/0224920 | A1 | 9/2010 | Lee | |
| 2011/0017971 | A1* | 1/2011 | Kim et al. | 257/5 |
| 2011/0272770 | A1 | 11/2011 | Hatada | |

FOREIGN PATENT DOCUMENTS

JP 2010-142418 7/2012
KR 1020100018814 A 2/2010

* cited by examiner

*Primary Examiner* — Brook Kebede
(74) *Attorney, Agent, or Firm* — Myers Bigel Sibley & Sajovec, P.A.

(57) ABSTRACT

A nonvolatile memory device is provided. The nonvolatile memory device comprises a plurality of impurity regions formed in a substrate, a first contact electrically connected to at least one of the impurity regions, a second contact electrically connected to at least one of the impurity regions, a first information storage portion formed at a first height from the substrate and electrically connected to the first contact, and a second information storage portion formed at a second height, which is different from the first height, from the substrate and electrically connected to the second contact.

21 Claims, 13 Drawing Sheets

NON-VOLATILE MEMORY DEVICES AND METHODS OF FABRICATING THE SAME

This application claims priority from Korean Patent Application No. 10-2013-0026250 filed on Mar. 12, 2013 in the Korean Intellectual Property Office, the disclosure of which is incorporated herein by reference in its entirety.

BACKGROUND

Examples of nonvolatile memories using resistance materials include phase-change random access memories (PRAMs), resistive RAMs (RRAMs), and magnetic RAMs (MRAMs). While dynamic RAMs (DRAMs) or flash memories store data using charges, nonvolatile memories using resistance materials store data using a state change of a phase-change material such as chalcogenide alloy (in the case of PRAMs), a resistance change of a variable resistance material (in the case of RRAMs), or a resistance change of a magnetic tunnel junction (MTJ) thin film according to a magnetization state of a ferromagnetic material (in the case of MRAMs).

Semiconductor products are increasingly becoming smaller in volume but are required to process high-volume data. Therefore, it may be required to increase the operation speed and integration density of memory devices used in these semiconductor products. To meet these demands, an MRAM which implements a memory function using a change in resistance with respect to a change in the polarity of a magnetic material has been suggested and is being intensively researched.

SUMMARY

Aspects of the present invention provide nonvolatile memory devices with high integration density, in which a magnetic tunnel junction (MTJ) structure is formed on both top and bottom surfaces of a bottom electrode patterned in the shape of a three-dimensional pillar.

Aspects of the present invention also provide methods of fabricating a nonvolatile memory device, which has MTJ structures at different heights from a substrate, by using point-cusp magnetron-physical vapor deposition (PCM-PVD).

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided a nonvolatile memory device comprising a plurality of impurity regions formed in a substrate, a first contact electrically connected to at least one of the impurity regions, a second contact electrically connected to at least one of the impurity regions, a first information storage portion formed at a first height from the substrate and electrically connected to the first contact, and a second information storage portion formed at a second height, which is different from the first height, from the substrate and electrically connected to the second contact.

According to another aspect of the present invention, there is provided a nonvolatile memory device comprising a plurality of first information storage portions formed at a first height from a substrate and separated from each other along a first direction and a second direction which is different from the first direction, and a plurality of second information storage portions formed at a second height, which is different from the first height, from the substrate and arranged between the first information storage portions which are separated from each other, wherein each of the first and second information storage portions comprises a magnetic tunnel junction.

Some embodiments of the present invention are directed to nonvolatile memory devices that include a first information storage portion that includes a first magnetic tunnel junction and that is at a first height from a substrate, a second information storage portion that includes a second magnetic tunnel junction and that is at a second height from the substrate, the second height being different from the first height and an insulating layer pattern that is interposed between the first information storage portion and the substrate and between the second information storage portion and the substrate.

Some embodiments provide that the insulating layer pattern includes a protrusion defined by a trench formed in the insulating layer pattern, the first information storage portion is on the protrusion, and the second information storage portion is on a bottom surface of the trench.

In some embodiments, the first information storage portion is formed on a top surface of the protrusion and is not formed on the side surfaces of the protrusion. Some embodiments include insulating spacers that are formed on side surfaces of the first information storage portion and the side surfaces of the protrusion and a bit line which is electrically connected to the first information storage portion and the second information storage portion and fills the trench.

In some embodiments, the protrusion is shaped like an inverted quadrangular pyramid.

Some embodiments include a first bit line contact that electrically connects the first information storage portion and a bit line and a second bit line contact that electrically connects the second information storage portion and the bit line. Some embodiments include a tunneling insulating layer conformally formed on the insulating layer pattern that includes the protrusion and the trench.

Some embodiments include a first contact that is electrically connected to at least one of a plurality of impurity regions formed in the substrate and to the first information storage portion, a second contact that is electrically connected to at least one of the plurality of impurity regions in the substrate and to the second information storage portion. In some embodiments, the first contact comprises a first lower contact and a first upper contact, the first upper contact is formed on the first lower contact, and the first lower contact is formed at the same level as the second contact.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

BRIEF DESCRIPTION OF THE DRAWINGS

The above and other aspects and features of the present invention will become more apparent by describing in detail example embodiments thereof with reference to the attached drawings.

DETAILED DESCRIPTION OF THE EMBODIMENTS

Figure 1:
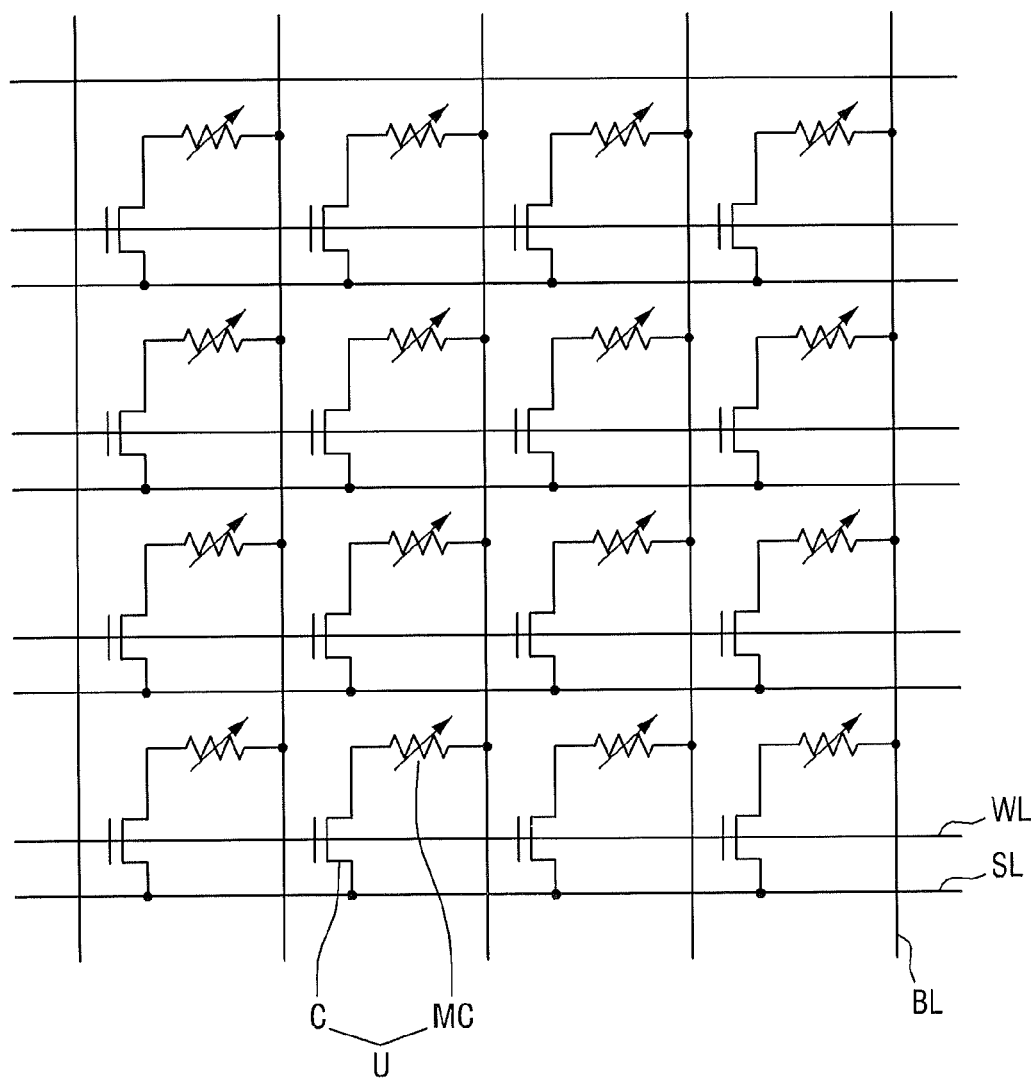
FIG. 1 is an equivalent circuit diagram of a nonvolatile memory device according to some embodiments of the present invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

FIG. 1 is an equivalent circuit diagram of a nonvolatile memory device according to embodiments of the present invention.

Referring to FIG. 1, a magnetic random access memory (MRAM) array includes a plurality of MRAM unit cells U arranged in a matrix. Each of the MRAM unit cells U includes an access part C and a memory cell MC. Each of the MRAM unit cells U is electrically connected to a word line WL and a bit line BL. When the access part C is a transistor as shown in FIG. 1, the MRAM array may further include a source line SL, which is electrically connected to a source region of the access part C. In FIG. 1, one access part C is connected to one source line SL. However, a plurality of access parts C can also be connected to one source line SL. The word line WL and the bit line BL may be arranged two-dimensionally at a predetermined angle, e.g., a right angle to each other. In addition, the word line WL and the source line SL may be arranged at a predetermined angle to each other, for example, the word line WL and the source line SL may be arranged parallel to each other.

The access part C controls the supply of current to the memory cell MC according to a voltage of the word line WL. The access part C may be a metal oxide semiconductor (MOS) transistor, a bipolar transistor, or a diode. In nonvolatile memory devices to be described below, the access part C will be described as a transistor.

The memory cell MC may contain a magnetic material and include a magnetic tunnel junction (MTJ). In addition, the memory cell MC may perform a memory function by using a spin transfer torque (STT) phenomenon in which a magnetization direction of a magnetic material varies according to an input current.

A nonvolatile memory device according to some embodiments of the present invention will now be described with reference to FIGS. 2 through 3B.

Figure 2:
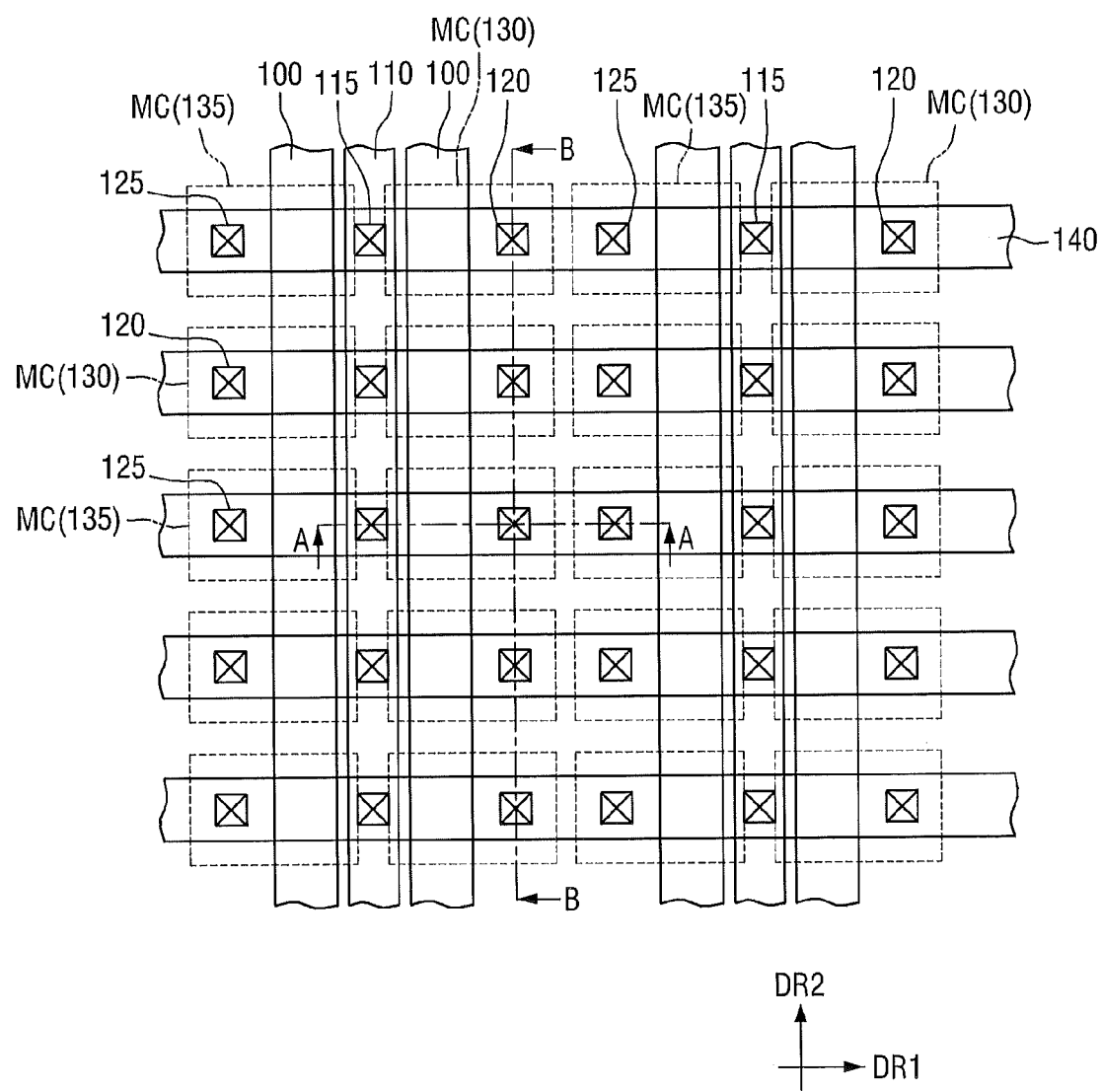
FIG. 2 is a layout diagram of a nonvolatile memory device according to some embodiments of the present invention.
Figure 3A:
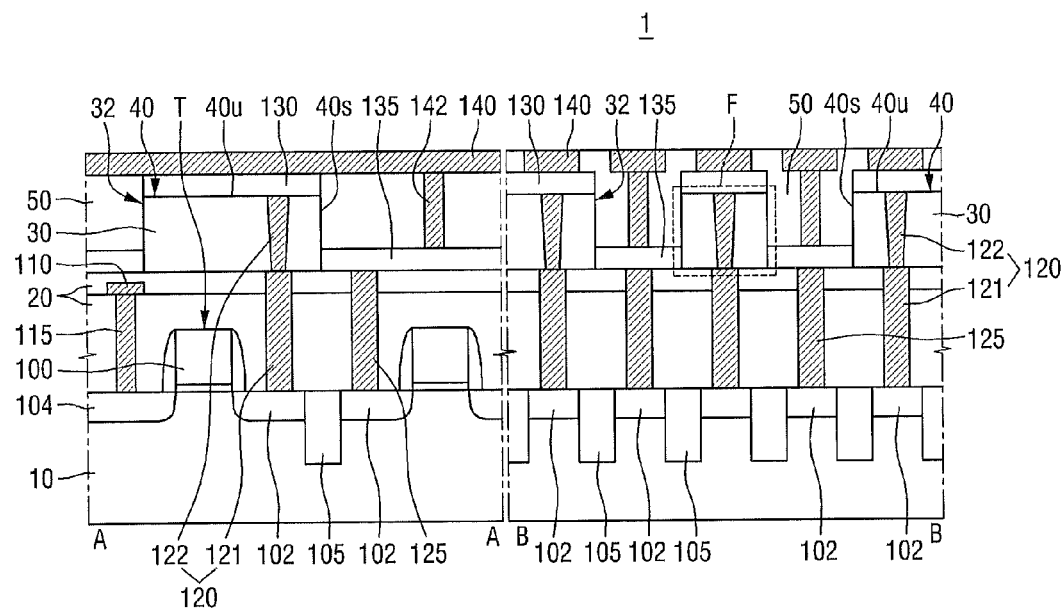
FIGS. 3A and 3B are views illustrating a nonvolatile memory device according to some embodiments of the present invention.

FIG. 2 is a layout diagram of a nonvolatile memory device according to embodiments of the present invention. FIGS. 3A and 3B are views illustrating a nonvolatile memory device 1 according to some embodiments of the present invention.

Figure 3B:
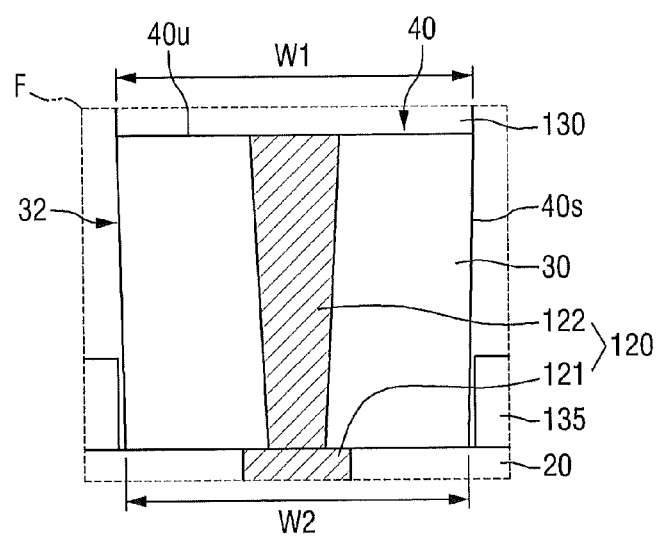

Specifically, FIG. 3A is a cross-sectional view taken along lines A-A and B-B of FIG. 2, and FIG. 3B is an enlarged view of a region F shown in FIG. 3A.

Referring to FIGS. 2 through 3B, the nonvolatile memory device 1 includes first impurity regions 104, second impurity regions 102, second contacts 120, third contacts 125, insulating layer patterns 30 including protrusions 40, first information storage portions 130, and second information storage portions 135.

Gate electrodes 100 extending in a second direction DR2 may be formed on a substrate 10. Each of the gate electrodes 100 may traverse a plurality of active regions of the substrate 10 which are defined by device isolation layers 105. The gate electrodes 100 may be, for example, the word lines WL shown in FIG. 1.

The first impurity regions 104 and the second impurity regions 102 are formed in the substrate 10 on both sides of each of the gate electrodes 100. The first and second impurity regions 104 and 102 are formed in each of the active regions defined by the device isolation layers 105. Therefore, the first impurity regions 104 are separated from each other along the second direction DR2, and the second impurity regions 102 are separated from each other along the second direction DR2. In addition, since the gate electrodes 100 are arranged along a first direction DR1, the first impurity regions 104 and the second impurity regions 102 are separated from each other along the first direction DR1. Each of the first impurity regions 104 is connected to a first contact 115 shared by adjacent gate electrodes 100, and the second impurity regions 102 are connected to the second and third contacts 120 and 125 (see FIG. 3A) which are connected to the first and second information storage portions 130 and 135 (see FIG. 3A), respectively. The first and second impurity regions 102 and 104 may be formed by doping impurities of a conductivity type opposite to a conductivity type of the substrate 10.

As shown in FIG. 3A, a plurality of transistors T, each including a gate electrode 100, a first impurity region 104 and a second impurity region 102, may be provided on the substrate 10. Each of the transistors T may include the gate electrode 100, a gate dielectric layer, spacers, the first impurity region 104, and the second impurity region 102.

The substrate 10 may be, for example, a bulk silicon substrate and/or a silicon-on-insulator (SOI) substrate. Otherwise, the substrate 10 may be a silicon substrate or may be a substrate formed of another material such as silicon germanium, indium antimonide, lead telluride, indium arsenide, indium phosphide, gallium arsenide, and/or gallium antimonide. In some embodiments, the substrate 10 may consist of a base substrate and an epitaxial layer formed on the base substrate. The gate dielectric layer may be a silicon oxide layer, a silicon oxynitride layer, $Ge_xO_yN_z$, $Ge_xSi_yO_z$, a high-k dielectric, a combination of these materials, and/or a sequential stack of these materials. The high-k dielectric may include, but is not limited to, one or more of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and/or lead zinc niobate. The gate electrodes 100 may include, but are not limited to, a metal such as tungsten (W), aluminum (Al), copper (Cu), titanium (Ti) or tantalum (Ta), a metal nitride such as tungsten nitride (WN), titanium nitride (TiN), tantalum nitride (TaN) or boron nitride (BN), and/or polysilicon. The spacers may include at least one of an oxide layer, an oxynitride layer, and/or a nitride layer.

In nonvolatile memory devices according to some embodiments of the present invention, planar transistors are used as the transistors T. However, the transistors T are not limited to the planar transistors. That is, the transistors T can have various structures such as a buried channel array transistor (BCAT) structure having a buried channel and a vertical channel array transistor (VCAT) structure having a vertical channel formed in a pillar-shaped unit active region.

First wiring lines 110 extend along the second direction DR2. The first wiring lines 110 are formed in a first interlayer insulating film 20. The first wiring lines 110 are electrically connected to the first impurity regions 104 by the first contacts 115 formed in the first interlayer insulating film 20. The first wiring lines 110 may be the source lines SL shown in FIG. 1. The first wiring lines 110 and the first contacts 115 may include at least one of a doped semiconductor material, a metal, a conductive metal nitride, and a metal-semiconductor compound. The first interlayer insulating film 20 is formed on the substrate 10 to cover the gate electrodes 100 and the transistors T. The first interlayer insulating film 20 may include at least one of an oxide layer, a nitride layer and/or an oxynitride layer and may consist of multiple layers.

In nonvolatile memory devices according to some embodiments of the present invention, the first contacts 115 are arranged in the second direction DR2 and are formed in the shape of dots. However, the present invention is not limited thereto. That is, the first contacts 115 may be formed in the shape of a line which connects the first impurity regions 104 in the second direction DR2. In addition, the first contacts 115 may serve as each of the first wiring lines 110.

The second contacts 120 and the third contacts 125 are formed on the second impurity regions 102 and are electrically connected to the second impurity regions 102, respectively. In other words, each of the second contacts 120 is electrically connected to at least one of the second impurity regions 102, and each of the third contacts 125 is electrically connected to at least one of the second impurity regions 102. The second contacts 120 and the third contacts 125 may include at least one of a doped semiconductor material, a metal, a conductive metal nitride, and/or a metal-semiconductor compound.

A height of the second contacts 120 may be greater than a height of the third contacts 125. That is, top surfaces of the second contacts 120 may be located farther from the substrate 10 than top surfaces of the third contacts 125. Specifically, each of the second contacts 120 includes a second lower contact 121 and a second upper contact 122 formed on the second lower contact 121. The second lower contacts 121 are formed in the first interlayer insulating film 20 and penetrate the first interlayer insulating film 20 to be electrically connected to corresponding ones of the second impurity regions 102. The second upper contacts 122 protrude from the first interlayer insulating film 20 and are respectively formed in the protrusions 40 of the insulating layer patterns 30, which will be described later. The third contacts 125, like the second lower contacts 121, are formed in the first interlayer insulating film 20 and penetrate the first interlayer insulating film 20 to be electrically connected to corresponding ones of the second impurity regions 102. The second lower contacts 121 and the third contacts 125 in the first interlayer insulating film 20 are formed at the same level. As used herein, the term "same level" means that elements are formed by the same fabrication process. Since the second contacts 120 include not only the second lower contacts 121 formed at the same level as the third contacts 125 but also the second upper contacts 122, the height of the second contacts 120 may be greater than the height of the third contacts 125, and the top surfaces of the second contacts 120 are located farther from the substrate 10 than the top surfaces of the third contacts 125.

The second contacts 120 and the third contacts 125 are arranged repeatedly along the second direction DR2 and are separated from each other. That is, the second contacts 120 and the third contacts 125 are alternately arranged along the second direction DR2. In addition, the second contacts 120, the first contacts 115, and the third contacts 125 are arranged repeatedly along the first direction DR1 and are separated from each other. That is, if seen without the first contacts 115, the second contacts 120 and the third contacts 125 are alternately arranged along the first direction DR1.

Contacts located closest to the second contacts 120 along the first direction DR1 are the third contacts 125. In addition, contacts located closest to the second contacts 120 along the second direction DR2 are the third contacts 125.

The insulating layer patterns 30 are disposed on the first interlayer insulating film 20. The insulating layer patterns 30 include trenches 32 formed therein and the protrusions 40 defined by the trenches 32. In other words, the insulating layer patterns 30 are interposed between the substrate 10 and the first information storage portions 130 and between the substrate 10 and the second information storage portions 135. The insulating layer patterns 30 may include at least one of an oxide layer, a nitride layer and/or an oxynitride layer and may consist of multiple layers.

The trenches 32 formed in the insulating layer patterns 30 may be box-shaped trenches. The protrusions 40 defined by the trenches 32 may be shaped like three-dimensional pillars.

Each of the protrusions 40 included in the insulating layer patterns 30 includes the second upper contact 122 therein. Each of top surfaces 40u of the protrusions 40 may expose the second upper contact 122. In other words, a height of the protrusions 40 may be substantially equal to a height of the second upper contact 122.

The shape of the protrusions 40 will now be described in detail with reference to FIG. 3B. In nonvolatile memory devices according to embodiments of the present invention, the protrusions 40 may be shaped like inverted quadrangular pyramids. That is, an upper part of each protrusion 40 may have a first width w1, and a lower part of each protrusion 40 may have a second width w2. Since the first width w1 of the upper part of each protrusion 40 is greater than the second width w2 of the lower part of the protrusion 40, the protrusions 40 may be shaped like inverted quadrangular pyramids.

In addition, the lower part of each protrusion 40 is entirely overlapped by the upper part of the protrusion 40. Specifically, the width of each protrusion 40 may be continuously reduced from the upper part to the lower part of the protrusion 40.

The protrusions 40 are defined and formed by the trenches 32 as described above. Since side surfaces (40s) of each trench 32 meet a bottom surface thereof at an acute angle to each other, the protrusions 40 may be shaped like inverted quadrangular pyramids.

The first information storage portions 130 are formed on the second contacts 120 and are electrically connected to the second contacts 120. The second information storage portions 135 are formed on the third contacts 125 and are electrically connected to the third contacts 125. While the first information storage portions 130 and the second information storage portions 135 are electrically connected to the second impurity regions 102 by the second contacts 120 and the third contacts 125, respectively, they are controlled by different transistors T. Therefore, memory cells which respectively include the first information storage portions 130 and the second information storage portions 135 operate independently. The first information storage portions 130 and the second information storage portions 135 will be described in more detail later with reference to FIGS. 7 and 8.

A distance from the substrate 10 to the first information storage portions 130 is a first height, and a distance from the substrate 10 to the second information storage portions 135 is a second height. As shown in FIG. 3A, the first height and the second height are different. Since the first information storage portions 130 are formed on the second contacts 120 while the second information storage portions 135 are formed on the third contacts 125, the first height from the substrate 10 to the first information storage portions 130 is greater than the second height from the substrate 10 to the second information storage portions 135.

The first information storage portions 130 are formed on the protrusions 40 and expose side surfaces 40s of the protrusions 40. That is, the first information storage portions 130 are formed on the top surfaces 40u of the protrusions 40 but are not formed on the side surfaces 40s of the protrusions 40. The second information storage portions 135 are formed on the bottom surfaces of the trenches 32. Since the first information storage portions 130 are formed on the top surfaces 40u of the protrusions 40 and the second information storage portions 135 are formed on the bottom surfaces of the trenches 32, the first height from the substrate 10 to the first information storage portions 130 may be greater than the second height from the substrate 10 to the second information storage portions 135.

In FIG. 3A, the second information storage portions 135 are illustrated as being in contact with the side surfaces 40s of the protrusions 40. However, this illustration is merely intended for ease of description. That is, the second information storage portions 135 are separated from the side surfaces 40s of the protrusions 40. Referring to FIG. 3B, since the lower parts of the protrusions 40 are entirely overlapped by the upper parts of the protrusions 40, when the second information storage portions 135 are formed on the bottom surfaces of the trenches 32, the upper parts of the protrusions 40 serve as a mask. Therefore, the second information storage portions 135 may be separated from the side surface 40s of the protrusions 40 by a width by which the bottom surfaces of the trenches 32 are overlapped by the upper parts of the protrusions 40.

The first information storage portions 130 are arranged on the substrate 10 to be separated from each other along the first direction DR1 and the second direction DR2. The second information storage portions 135 are arranged between the first information storage portions 130, which are separated from each other along the first direction DR1 and the second direction DR2. That is, the first and second information storage portions 130 and 135 are arranged repeatedly along the first direction DR1 as well as the second direction DR2. The first and second information storage portions 130 and 135 are alternately arranged along not only the first direction DR1 but also the second direction DR2. The pattern in which the first and second information storage portions 130 and 135 are arranged two-dimensionally is substantially identical to the pattern in which the second and third contacts 120 and 125 are arranged two-dimensionally.

Second wiring lines 140 extend in the first direction DR1 and are formed on the first information storage portions 130 and the second information storage portions 135. The second wiring lines 140 overlap the first and second information storage portions 130 and 135 which are alternately arranged along the first direction DR1. The second wiring lines 140 are electrically connected to the first and second information storage portions 130 and 135 which are alternately arranged along the first direction DR1. The second wiring lines 140 may be the bit lines BL shown in FIG. 1.

In the nonvolatile memory device 1 according to some embodiments of the present invention, the first information storage portions 130 are in contact with and thus electrically connected to the second wiring lines 140 disposed in a second interlayer insulating film 50. On the other hand, the second information storage portions 135, which are at a different height from the first information storage portions 130, are electrically connected to the second wiring lines 140 by second wiring contacts 142 disposed in the second interlayer insulating film 50.

The second wiring lines 140 and the second wiring contacts 142 may include at least one of a metal and/or a conductive metal nitride, specifically, copper (Cu). The second interlayer insulating film 50 may include at least one of an oxide layer, a nitride layer, and/or an oxynitride layer. The second interlayer insulating film 50 shown in FIG. 3A is a single layer. However, the present invention is not limited thereto, and the second interlayer insulating film 50 may also be formed as a multilayer.

A nonvolatile memory device according to some other embodiments of the present invention will now be described with reference to FIGS. 2 and 4. The current embodiments may be substantially identical to the previously described embodiments except that they further include a wiring contact between a second wiring line and a first information storage portion. Therefore, elements substantially identical to those of the previous embodiments are indicated by like reference numerals, and their description will be simplified or omitted.

Figure 4:
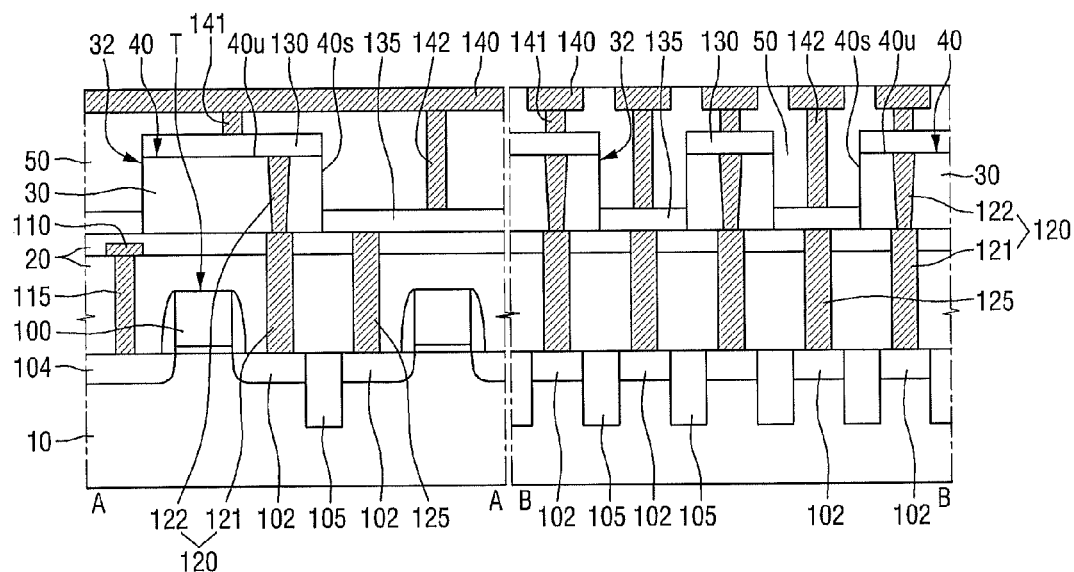
FIG. 4 is a view illustrating a nonvolatile memory device according to some embodiments of the present invention.

FIG. 4 is a view illustrating a nonvolatile memory device 2 according to some embodiments of the present invention.

Referring to FIGS. 2 and 4, the nonvolatile memory device 2 includes first impurity regions 104, second impurity regions 102, second contacts 120, third contacts 125, insulating layer patterns 30 including protrusions 40, first information storage portions 130, second information storage portions 135, second wiring lines 140, first wiring contacts 141, and second wiring contacts 142.

The second wiring lines 140 extend in the first direction DR1 and are formed on the first information storage portions 130 and the second information storage portions 135. The second wiring lines 140 overlap the first and second information storage portions 130 and 135, which are alternately arranged along the first direction DR1. The second wiring lines 140 are electrically connected to the first and second information storage portions 130 and 135, which are alternately arranged along the first direction DR1.

In the nonvolatile memory device 2 according to the some embodiments of the present invention, the first information storage portions 130 are electrically connected to the second wiring lines 140 by the first wiring contacts 141 disposed in a second interlayer insulating film 50. In addition, the second information storage portions 135 are electrically connected to the second wiring lines 140 by the second wiring contacts 142 disposed in the second interlayer insulating film 50.

Since there is a step difference between the first information storage portions 130 and the second information storage portions 135, the first wiring contacts 141 and the second wiring contacts 142 have different heights. The first wiring contacts 141 and the second wiring contacts 142 may be formed at the same level. However, the present invention is not limited thereto.

The first wiring contacts 141 may include at least one of a metal and a conductive metal nitride, specifically, Cu.

A nonvolatile memory device according to some other embodiments of the present invention will now be described with reference to FIGS. 2 and 5. Any repetitive description of elements and features identical to those of the previous embodiments will be simplified or omitted.

Figure 5:
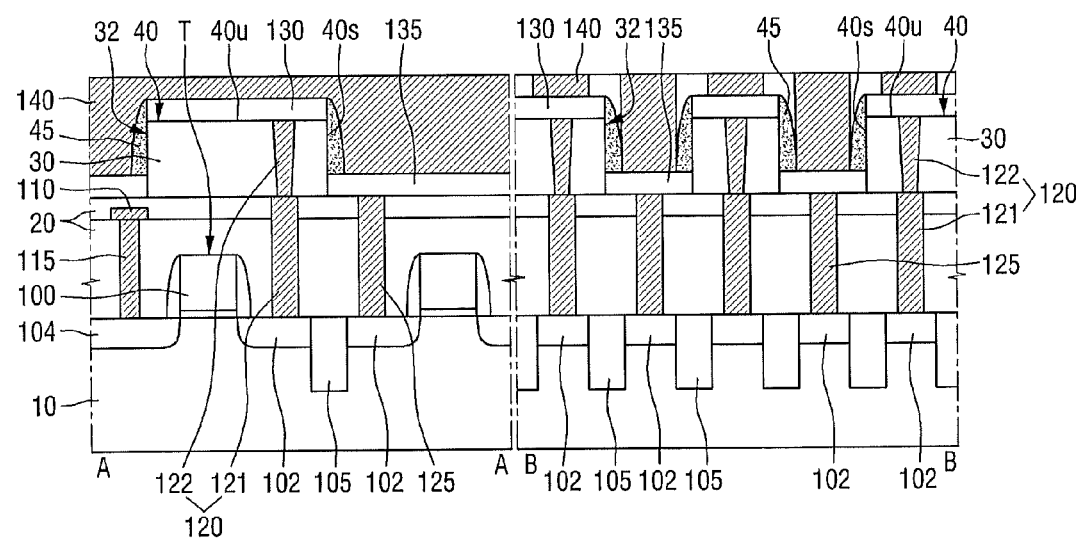
FIG. 5 is a view illustrating a nonvolatile memory device according to some embodiments of the present invention.

FIG. 5 is a view illustrating a nonvolatile memory device 3 according to some other embodiments of the present invention.

Referring to FIGS. 2 and 5, the nonvolatile memory device 3 includes first impurity regions 104, second impurity regions 102, second contacts 120, third contacts 125, insulating layer patterns 30 including protrusions 40, first information storage portions 130, second information storage portions 135, insulating spacers 45, and second wiring lines 140.

The insulating spacers 45 may be formed on side surfaces of the first information storage portions 130 and side surfaces 40s of the protrusions 40. That is, the insulating spacers 45 are formed on side surfaces of trenches 32. The insulating spacers 45 include an insulating material, for example, at least one of an oxide layer, a nitride layer, and/or an oxynitride layer. The insulating spacers 45 shown in FIG. 5 are single layers. However, the present invention is not limited thereto.

The insulating spacers 45 are formed between the first information storage portions 130 and the second information storage portions 135. Since the insulating spacers 45 are disposed on the second information storage portions 135, they may overlap the second information storage portions 135. Therefore, the second information storage portions 135 are partially covered by the insulating spacers 45.

The second wiring lines 140 extend in the first direction DR1 and are formed on the first information storage portions 130 and the second information storage portions 135. The second wiring lines 140 overlap the first and second information storage portions 130 and 135 which are alternately arranged along the first direction DR1. The second wiring lines 140 are electrically connected to the first and second information storage portions 130 and 135 which are alternately arranged along the first direction DR1.

In a cross-sectional view of the nonvolatile memory device 3 according to some embodiments taken along line A-A of FIG. 2, the second wiring lines 140 extending in the first direction DR1 fill the trenches 32 having the insulating spacers 45 formed on the side surfaces thereof and are in contact with and thus electrically connected to the first information storage portions 130 and the second information storage portions 135.

The first information storage portions 130 and the second information storage portions 135 are electrically insulated by the insulating spacers 45 disposed between the first information storage portions 130 and the second information storage portions 135. Accordingly, memory cells, which respectively include the first information storage portions 130 and the second information storage portions 135 alternately arranged along the first direction DR1, are electrically insulated and operate independently.

Since the insulating spacers 45 electrically insulate the first and second information storage portions 130 and 135, the first and second information storage portions 130 and 135 alternately arranged along the first direction DR1 may be electrically connected to the second wiring lines 140 without wiring contacts although there exists a step difference between the first information storage portions 130 and the second information storage portions 135.

In a cross-sectional view taken along line B-B of FIG. 2, the insulating spacers 45 formed on the side surfaces 40s of the protrusions 40 which are adjacent one another in the second direction DR2 do not contact the second wiring lines 140. However, this is merely intended for ease of description, and the present invention is not limited thereto.

A nonvolatile memory device according to some embodiments of the present invention will now be described with reference to FIGS. 2 and 6. Any repetitive description of elements and features identical to those of the previous embodiments will be simplified or omitted.

Figure 6:
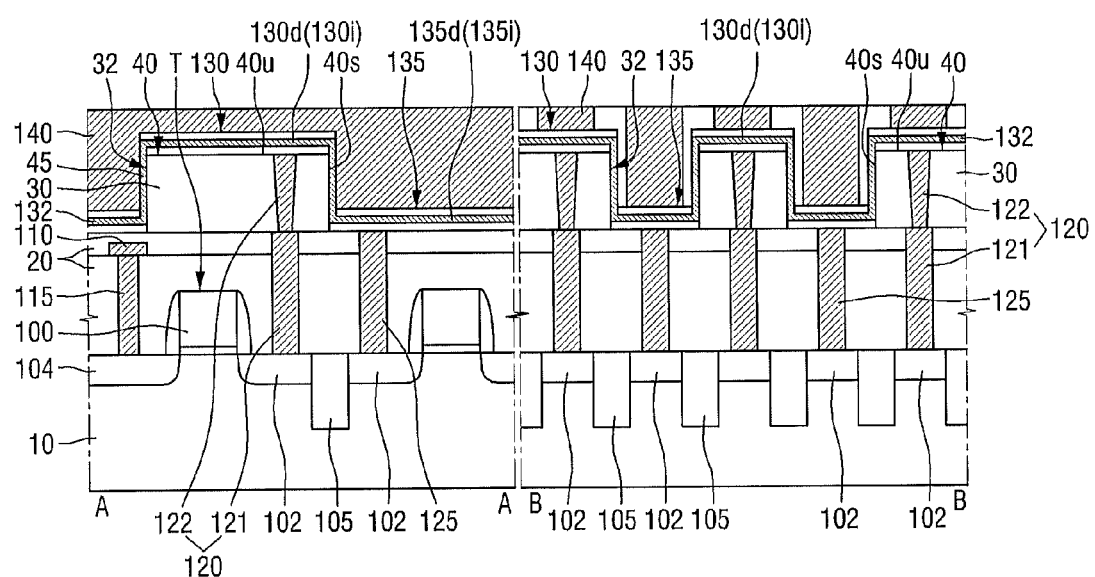
FIG. 6 is a view illustrating a nonvolatile memory device according to some embodiments of the present invention.

FIG. 6 is a view illustrating a nonvolatile memory device 4 according to some embodiments of the present invention.

Referring to FIGS. 2 and 6, the nonvolatile memory device 4 includes first impurity regions 104, second impurity regions 102, second contacts 120, third contacts 125, insulating layer patterns 30 including protrusions 40, first information storage portions 130, second information storage portions 135, a tunneling insulating layer 132, and second wiring lines 140.

The tunneling insulating layer 132 is conformally formed on the insulating layer patterns 30. Specifically, the tunneling insulating layer 132 is formed on top surfaces 40u and side surfaces 40s of the protrusions 40 and is conformally formed on bottom surfaces of trenches 32. The tunneling insulating layer 132 includes an insulating material, specifically, a material included in a tunnel barrier pattern (130d or 130i), which will be described in detail later with reference to FIGS. 7 and 8.

The tunneling insulating layer 132 may be formed on the entire memory cell part of the nonvolatile memory device shown in FIG. 2. The tunneling insulating layer 132 is formed on some layers (including a first bottom electrode of FIGS. 7 and 8) of each of the first information storage portions 130 that are formed on the top surfaces 40e of the protrusions 40 and on some layers of each of the second information storage portions 135 that are formed on the bottom surfaces of the trenches 32. However, the tunneling insulating layer 132 disposed on the side surfaces 40s of the protrusions 40 may contact the protrusions 40.

Each of the first information storage portions 130 and each of the second information storage portions 135 include a first tunnel barrier pattern 130d or 130i and a second tunnel barrier pattern 135d or 135i, respectively. A portion of the tunneling insulating layer 132, which is formed on each of the top surfaces 40u of the protrusions 40, is the first tunnel barrier pattern 130d or 130i of each of the first information storage portions 130. A portion of the tunneling insulating layer 132, which is formed on each of the bottom surfaces of the trenches 32, is the second tunnel barrier pattern 135d or 135i of each of the second information storage portions 135.

The second wiring lines 140 extend in the first direction DR1 and are formed on the first information storage portions 130 and the second information storage portions 135. The second wiring lines 140 overlap the first and second information storage portions 130 and 135 which are alternately arranged along the first direction DR1. The second wiring lines 140 are electrically connected to the first and second information storage portions 130 and 135, which are alternately arranged along the first direction DR1. The tunneling insulating layer 132 is disposed between the second wiring lines 140 and the insulating layer patterns 30.

In a cross-sectional view of the nonvolatile memory device 4 according to some embodiments taken along line A-A of FIG. 2, the second wiring lines 140 extending in the first direction DR1 fill the trenches 32 having the tunneling insulating layer 132 formed on side surfaces thereof and are in contact with and thus electrically connected to the first information storage portions 130 and the second information storage portions 135.

The first information storage portions 130 and the second information storage portions 135 are electrically insulated by the tunneling insulating layer 132 which is formed on the top surfaces 40u and the side surfaces 40s of the protrusions 40 and is conformally formed on the bottom surfaces of the trenches 32. That is, some layers of each of the first information storage portions 130 disposed under the tunneling insulating layer 132 and some layers of each of the second information storage portions 135 disposed under the tunneling insulating layer 132 are electrically insulated by portions of the tunneling insulating layer 132, which are disposed on the side surfaces 40s of the protrusions 40, part of side surfaces of the first information storage portions 130, and part of side surfaces of the second information storage portions 135. Accordingly, memory cells which respectively include the first information storage portions 130 and the second information storage portions 135 alternately arranged along the first direction DR1 are electrically insulated and operate independently.

Since the tunneling insulating layer 132 formed on the insulating layer patterns 30 electrically insulates the first and second information storage portions 130 and 135, the first and second information storage portions 130 and 135 alternately arranged along the first direction DR1 may be electrically connected to the second wiring lines 140 without wiring contacts although there exists a step difference between the first information storage portions 130 and the second information storage portions 135.

A first information storage portion and a second information storage portion included in non-volatile memory devices according to embodiments of the present invention will now be described in detail with reference to FIGS. 7 and 8.

The first information storage portion and the second information storage portion are formed at different heights from a substrate but are formed at the same level. Therefore, a description of the first information storage portion may also be applied to the second information storage portion.

Figure 7:
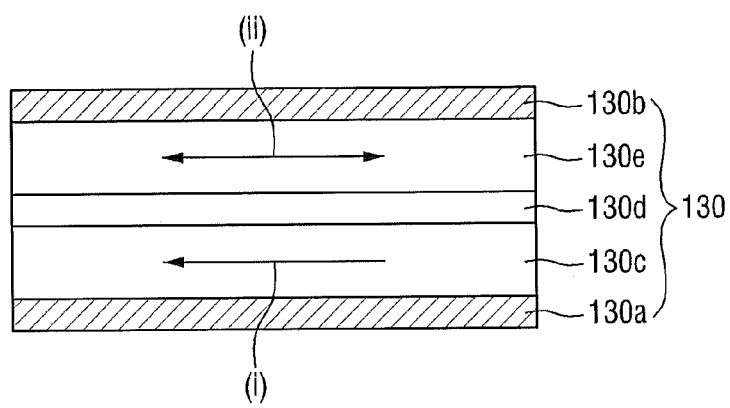
FIG. 7 is a cross-sectional view of an example of a first information storage portion included in non-volatile memory devices according to some embodiments of the present invention.

FIG. 7 is a cross-sectional view of an example of a first information storage portion included in non-volatile memory devices according to some embodiments of the present invention. FIG. 8 is a cross-sectional view of another example of the first information storage portion included in the non-volatile memory devices according to some embodiments of the present invention.

Referring to FIG. 7, a first information storage portion 130 according to the current example may include a first reference pattern 130c, a first free pattern 130e, and a first tunnel barrier pattern 130d interposed between the first reference pattern 130c and the first free pattern 130e. The first reference pattern 130c has a magnetization direction (i) fixed in a direction, and the first free pattern 130e has a magnetization direction (ii) switchable between parallel to and anti-parallel to the magnetization direction (i) of the first reference pattern 130c. The magnetization directions (i) and (ii) of the first reference pattern 130c and the first free pattern 130e may be parallel to a surface of the first tunnel barrier pattern 130d, which contacts the first free pattern 130e. The first reference pattern 130c, the first tunnel barrier pattern 130d and the first free pattern 130e may form an MTJ.

When the magnetization direction (ii) of the first free pattern 130e is parallel to the magnetization direction (i) of the first reference pattern 130c, the first information storage portion 130 may have a first resistance value. When the magnetization direction (ii) of the first free pattern 130e is anti-parallel to the magnetization direction (i) of the first reference pattern 130c, the first information storage portion 130 may have a second resistance value. Here, the first resistance value may be smaller than the second resistance value. Using this difference between the first and second resistance values, the first information storage portion 130 may store logic data.

The magnetization direction (ii) of the first free pattern 130e may vary according to spin torque of electrons in a program current.

The first reference pattern 130c and the first free pattern 130e may include a ferromagnetic material. The first reference pattern 130c may further include an anti-ferromagnetic material that pins a magnetization direction of the ferromagnetic material in the first reference pattern 130c. The first tunnel barrier pattern 130d may include at least one of magnesium oxide, titanium oxide, aluminum oxide, magnesium-zinc oxide, and magnesium-boron oxide.

The first information storage portion 130 may further include a first bottom electrode 130a and a first top electrode 130b. The first reference pattern 130c, the first tunnel barrier pattern 130d and the first free pattern 130e may be disposed between the first bottom electrode 130a and the first top electrode 130b. As shown in FIG. 7, the first reference pattern 130c, the first tunnel barrier pattern 130d and the first free pattern 130e may be disposed sequentially on the first bottom electrode 130a, and the first top electrode 130b may be disposed on the first free pattern 130e. Otherwise, the first free pattern 130e, the first tunnel barrier pattern 130d, and the first reference pattern 130c may be stacked sequentially on the first bottom electrode 130a. The first bottom electrode 130a and the first top electrode 130b may include a conductive metal nitride such as titanium nitride, tantalum nitride, and/or tungsten nitride.

Figure 8:
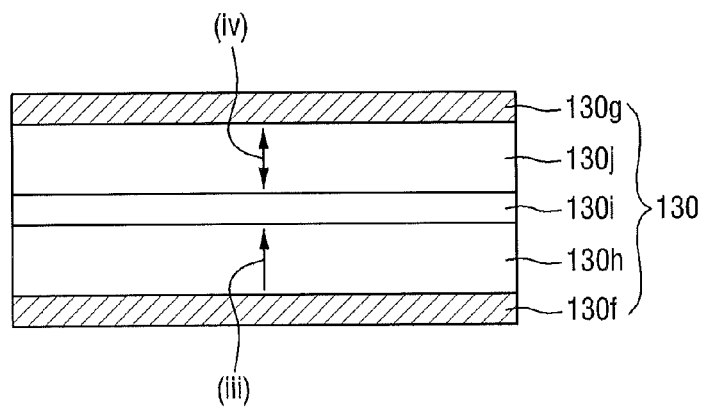
FIG. 8 is a cross-sectional view of another example of the first information storage portion included in the non-volatile memory devices according to some embodiments of the present invention.

Referring to FIG. 8, a first information storage portion 130 according to the current example may include a first reference perpendicular pattern 130h, a first free perpendicular pattern 130j, and a first tunnel barrier pattern 130i interposed between the first reference perpendicular pattern 130h and the first free perpendicular pattern 130j. The first reference perpendicular pattern 130h may have a magnetization direction (iii) fixed in a direction, and the first free perpendicular pattern 130j may have a magnetization direction (iv) switchable between parallel to and anti-parallel to the fixed magnetization direction (iii) of the first reference perpendicular pattern 130h. The magnetization directions (iii) and (iv) of the first reference perpendicular pattern 130h and the first free perpendicular pattern 130j may be perpendicular to a surface of the first tunnel barrier pattern 130i which contacts the first free perpendicular pattern 130j.

The first reference perpendicular pattern 130h and the first free perpendicular pattern 130j may include at least one of a perpendicular magnetic material such as CoFeTb, CoFeGd or CoFeDy, a perpendicular magnetic material having an L10 structure, CoPt having a hexagonal close-packed lattice structure, and a perpendicular magnetic structure. The perpendicular magnetic material having the L10 structure may include at least one of FePt having the L10 structure, FePd having the L10 structure, CoPd having the L10 structure and CoPt having the L10 structure. The perpendicular magnetic structure may include magnetic layers and non-magnetic layers arranged alternately and repeatedly. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n and/or (CoCr/Pd)n, where n is the number of stacked layers. The first reference perpendicular pattern 130h may be thicker than the first free perpendicular pattern 130j, and coercivity of the first reference perpendicular pattern 130h may be greater than that of the first free perpendicular pattern 130j.

The first tunnel barrier pattern 130i may include at least one of magnesium oxide, titanium oxide, aluminum oxide, magnesium-zinc oxide, and/or magnesium-boron oxide. The first information storage portion 130 may include a first bottom electrode 130f and a first top electrode 130g. As shown in FIG. 8, the first reference perpendicular pattern 130h, the first tunnel barrier pattern 130i, and the first free perpendicular pattern 130j may be stacked sequentially on the first bottom electrode 130f, and the first top electrode 130g may be disposed on the first free perpendicular pattern 130j. Otherwise, the first free perpendicular pattern 130j, the first tunnel barrier pattern 130i and the first reference perpendicular pattern 130h may be stacked sequentially on the first bottom electrode 130f, and the first top electrode 130g may be disposed on the first reference perpendicular pattern 130h. The first bottom electrode 130f and the first top electrode 130g may be formed of a conductive metal nitride.

Methods of fabricating a nonvolatile memory device according to some embodiments of the present invention will now be described with reference to FIGS. 2, 4 and 9 through 14.

FIGS. 9 through 14 are views illustrating operations corresponding to methods of fabricating a nonvolatile memory device according to some embodiments of the present invention.

Figure 9:
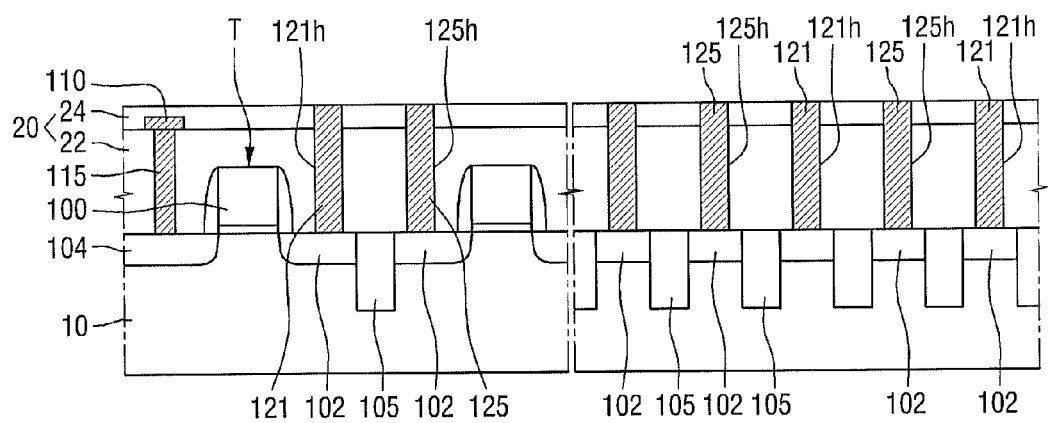
FIGS. 9 through 14 are views illustrating operations of methods of fabricating a nonvolatile memory device according to some embodiments of the present invention.

Referring to FIGS. 2 and 9, first impurity regions 104 and second impurity regions 102 are formed in a substrate 10. The second impurity regions 102 are separated from each other along the first direction DR1 and the second direction DR2.

After the formation of the second impurity regions 102, second lower contacts 121 and third contacts 125 are formed to be electrically connected to the second impurity regions 102. The second lower contacts 121 and the third contacts 125 are alternately arranged. That is, the second lower contacts 121 and the third contacts 125 are alternately arranged along the first direction DR1 and the second direction DR2.

Specifically, a plurality of active regions may be defined by forming a plurality of device isolation layers 105 in the substrate 10. The active regions may be separated from each other along the first direction DR1 and the second direction DR2. The device isolation layers 105 may be, for example, trench-type device isolation patterns.

A plurality of transistors T may be formed. Each of the transistors T may include a gate electrode 100 which extends in the second direction DR2 and is formed on the substrate 10 having the active regions defined. Each of the gate electrodes 100 may be formed to traverse the active regions arranged along the second direction DR2. When the transistors T are formed, the first impurity regions 104 and the second impurity regions 102 are formed in the substrate 10 on both sides of each of the gate electrodes 100. Since the first impurity regions 104 and the second impurity regions 102 are formed in each of the active regions defined by the device isolation layers 105, the second impurity regions 102 are separated from each other along the first direction DR1 and the second direction DR2.

After the formation of the transistors T, a first lower interlayer insulating film 22 may be formed on the substrate 10 to cover the gate electrodes 100. The first lower interlayer insulating film 22 may include at least one of an oxide layer, a nitride layer and/or an oxynitride layer and may be formed by chemical vapor deposition (CVD).

First contacts 115 formed in the first lower interlayer insulating film 22 are disposed on the first impurity regions 104 and are electrically connected to the first impurity regions 104. The first contacts 115 may be arranged along the second direction DR2.

The first contacts 115 may be formed in first contact holes 115h which penetrate the first lower interlayer insulating film 22 to expose the first impurity regions 104. The first contact holes 115h may be formed by forming mask patterns on the first lower interlayer insulating film 22 and patterning the first lower interlayer insulating film 22 by using the mask pattern as an etch mask. The first contacts 115 may be formed by filling the first contact holes 115h with a conductive material and then planarizing the conductive material. In the planarization process performed to form the first contacts 115, a top surface of the first lower interlayer insulating film 22 may also be planarized.

First wiring lines 110 are formed on the first lower interlayer insulating film 22 to extend along the second direction DR2. The first wiring lines 110 are electrically connected to the first impurity regions 104 by the first contacts 115 formed in the first lower interlayer insulating film 22.

After the formation of the first wiring lines 110, a first upper interlayer insulating film 24 may be formed on the substrate 10 to cover the first lower interlayer insulating film 22 and the first wiring lines 110. The first upper interlayer insulating film 24 may include at least one of an oxide layer, a nitride layer and/or an oxynitride layer and may be formed by CVD.

The second lower contacts 121 and the third contacts 125 may be formed in the first upper interlayer insulating film 24 and the first lower interlayer insulating film 22. In other words, the second lower contacts 121 and the third contacts 125 may be formed in a first interlayer insulating film 20 (22, 24) to penetrate the first interlayer insulating film 20. The second lower contacts 121 and the third contacts 125 are formed on the second impurity regions 102 in the substrate 10 and are electrically connected to the second impurity regions 102. The second lower contacts 121 and the third contacts 125 are alternately arranged along the first direction DR1 and the second direction DR2.

The second lower contacts 121 and the third contacts 125 may respectively be formed in second lower contact holes 121h and third contact holes 125h which penetrate the first interlayer insulating film 20 to expose the second impurity regions 102. The second lower contact holes 121h and the third contact holes 125h may be formed by forming mask patterns on the first interlayer insulating film 20 and patterning the first interlayer insulating film 20 using the mask patterns as an etch mask. The second lower contacts and the third contacts 125 may be formed by filling the second lower contact holes 121h and the third contact holes 125h with a conductive material and patterning the conductive material. The second lower contacts 121 and the third contacts 125 are formed at the same level.

Figure 10:
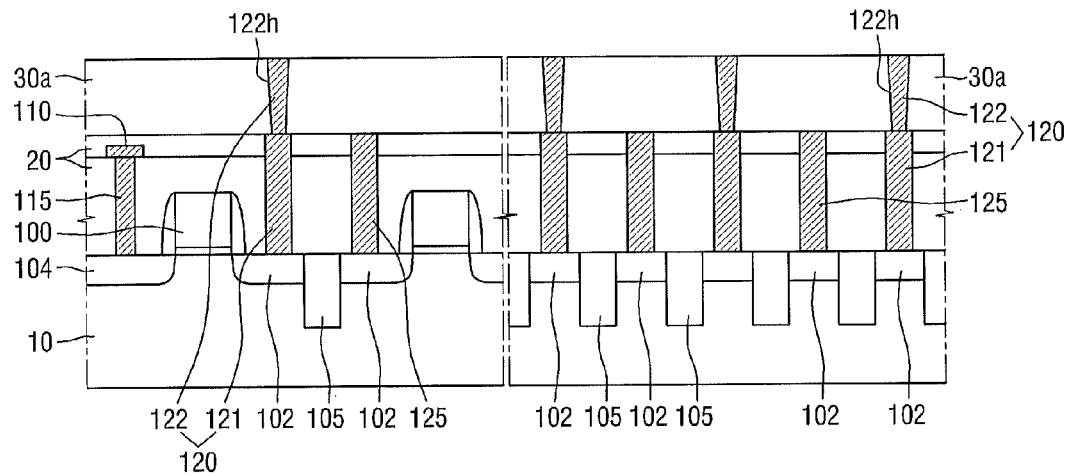

Referring to FIGS. 2 and 10, a pre-insulating layer 30a may be formed on the first interlayer insulating film 20, and second upper contacts 122 may be formed in the pre-insulating layer 30a. That is, the pre-insulating layer 30a covers the second lower contacts 121 and the third contacts 125. The second upper contacts 122 may be formed to overlap the second lower contacts 121.

The second upper contacts 122 are electrically connected to the second lower contacts 121 and are electrically connected to the second impurity regions 102 by the second lower contacts 121. The second upper and lower contacts 122 and 121 may be arranged in a row on each of the second impurity regions 102.

Specifically, the pre-insulating layer 30a may be formed on the first interlayer insulating film 20 to cover the second lower contacts 121 and the third contacts 125. The pre-insulating layer 30a may include at least one of an oxide layer, a nitride layer and/or an oxynitride layer and may be formed by CVD.

Then, the second upper contacts 122 may be formed in the pre-insulating layer 30a. That is, the second upper contacts 122 may be formed to penetrate the pre-insulating layer 30a.

The second upper contacts 122 may be formed in second upper contact holes 122h which penetrate the pre-insulating layer 30a to expose the second lower contacts 121. The second upper contact holes 122h may be formed by forming mask patterns on the pre-insulating layer 30a and patterning the pre-insulating layer 30a using the mask patterns as an etch mask. The second upper contacts 122 may be formed by filling the second upper contact holes 122h with a conductive material and patterning the conductive material. In the patterning process performed to form the second upper contacts 122, a top surface of the pre-insulating layer 30a may also be planarized.

Figure 11:
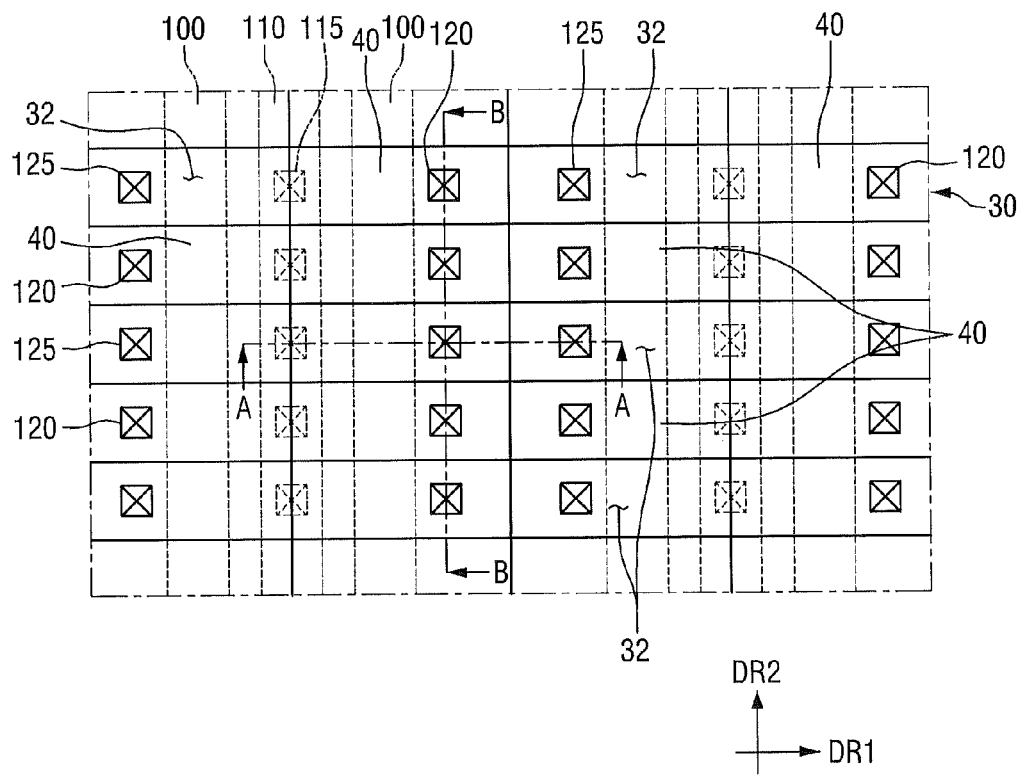
Figure 12:
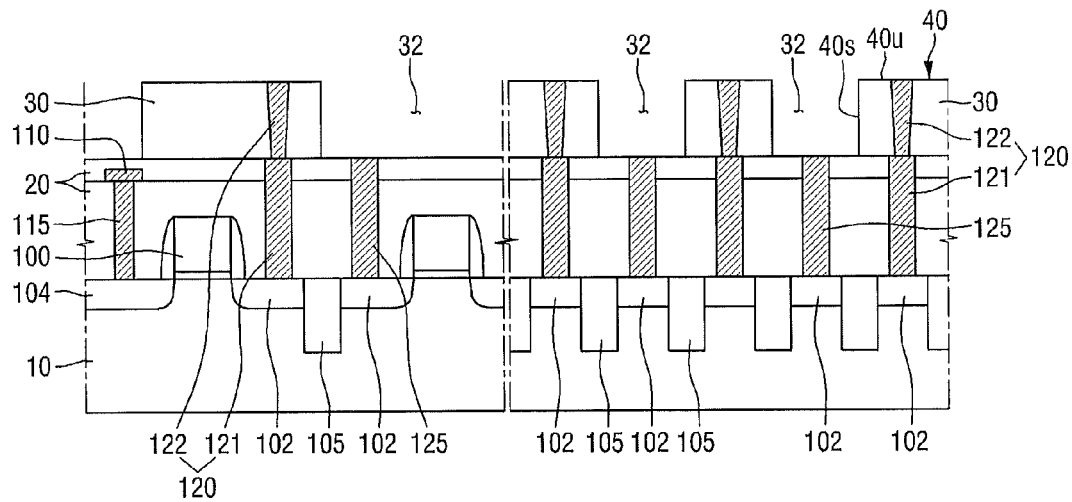

Referring to FIGS. 11 and 12, insulating layer patterns 30 are formed on the first interlayer insulating film 20. That is, the insulating layer patterns 30 are formed on the second lower contacts 121 and the third contacts 125.

The insulating layer patterns 30 include trenches 32 and protrusions 40 formed therein.

Specifically, mask patterns are formed on the pre-insulating layer 30a to cover the second upper contacts 122. The pre-insulating layer 30a is patterned using the mask patterns, which cover the second upper contacts 122, as an etch mask. That is, portions of the pre-insulating layer 30a which are not covered by the mask patterns are etched to form the trenches 32 in the pre-insulating layer 30a. The formation of the trenches 32 results in the formation of the insulating layer patterns 30 on the first interlayer insulating film 20, and the protrusions 40 are defined by the trenches 32. The etching process performed to form the trenches 32 includes at least one of a dry-etching process and a wet-etching process.

The trenches 32 formed in the insulating layer patterns 30 do not overlap the second upper contacts 122 and expose top surfaces of the third contacts 125. The second upper contacts 122 are disposed in the protrusions 40 defined by the trenches 32, respectively. The top surfaces of the third contacts 125 are exposed through bottom surfaces of the trenches 32, and top surfaces of the second upper contacts 122 are exposed through top surfaces 40u of the protrusions 40.

The protrusions 40 and the trenches 32 are alternately arranged along the first direction DR1 and the second direction DR2. That is, side surfaces of the trenches 32 are surrounded by side surfaces 40s of the protrusions 40, and the side surfaces 40s of the protrusions 40 are surrounded by the trenches 32.

Figure 13:
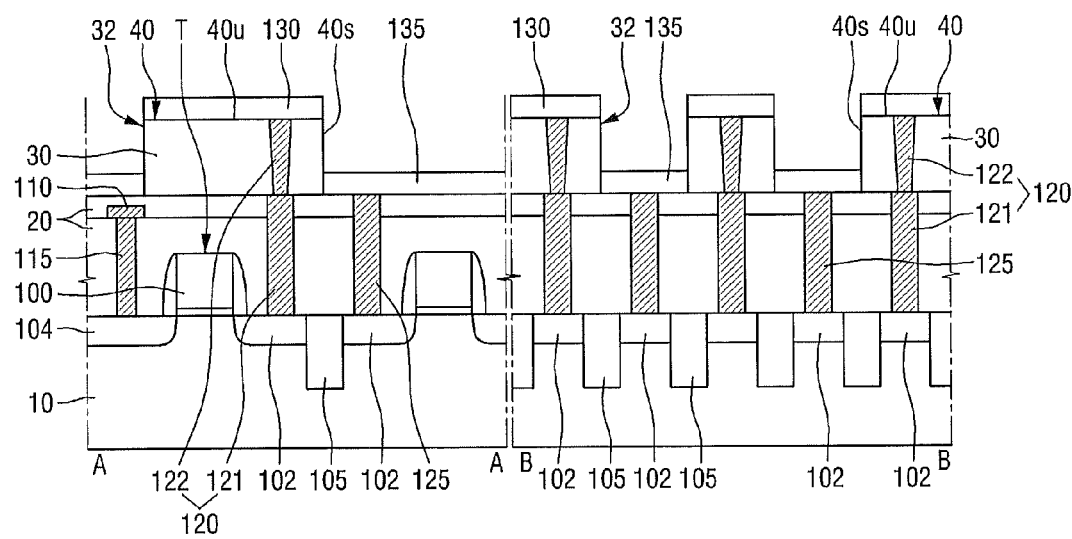

Referring to FIGS. 11 and 13, first information storage portions 130 exposing the side surfaces 40s of the protrusions 40 are formed on the protrusions 40 by using point cusp magnetron-physical vapor deposition (PCM-PVD). In addition, second information storage portions 135 are formed on the bottom surfaces of the trenches 32.

The first information storage portions 130 are electrically connected to the second contacts 120, and the second information storage portions 135 are electrically connected to the third contacts 125. Since the second contacts 120 and the third contacts 125 are electrically connected to the second impurity regions 102, the first and second information storage portions 130 and 135 are electrically connected to the second impurity regions 102 included in different transistors T, respectively.

The first information storage portions 130 are formed on the top surfaces 40u of the protrusions 40. That is, the first information storage portions 130 are formed on top surfaces of the insulating layer patterns 30. However, the first information storage portions 130 are not formed on the side surfaces 40s of the protrusions 40. That is, the first information storage portions 130 are formed neither on the side surfaces of the trenches 32 nor in the trenches 32.

The first information storage portions 130 may be formed on the top surfaces 40u of the protrusions 40 but not on the side surfaces 40s of the protrusions 40 by adjusting the conditions of the PCM-PVD process used to form the first information storage portions 130 and the second information storage portions 135.

To form a tunnel barrier pattern included in each of the first and second information storage portions 130 and 135, a metallic element for forming a tunnel barrier pattern is deposited using PCM-PVD. Then, the metallic element for forming the tunnel barrier pattern is oxidized by an oxidation process. As a result, the tunnel barrier pattern may be formed.

In FIG. 11, the protrusions 40 which are adjacent one another in the first direction DR1 and the second direction DR2 may contact each other. In this case, for node separation of the first information storage portions 130, portions of adjacent first information storage portions 130 that contact each other may be removed. In this case, a portion of a topmost layer (130b and 130g of FIGS. 7 and 8) of each of the first information storage portions 130 may serve as a sacrificial layer which is removed by an etching process.

Hereinafter, PCM-PVD used to form the first information storage portions 130 and the second information storage portions 135 and experimental data obtained using PCM-PVD will be described with reference to FIGS. 20 through 22.

Figure 20:
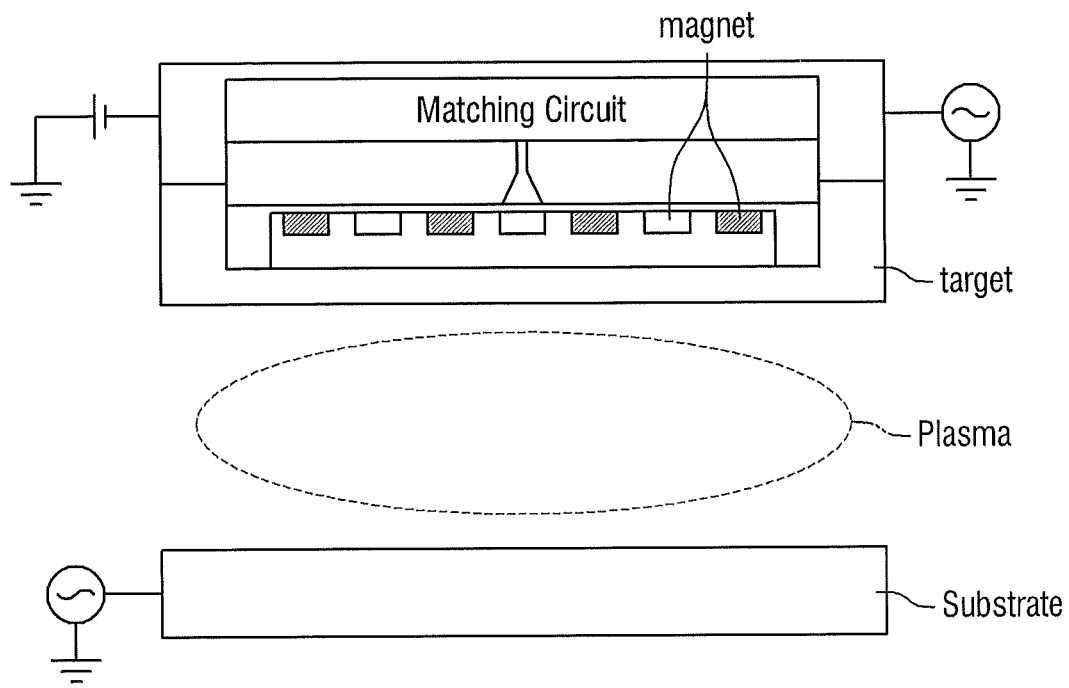
FIG. 20 is a schematic diagram illustrating point-cusp magnetron-physical vapor deposition (PCM-PVD) used in methods of fabricating a nonvolatile memory device according to some embodiments of the present invention.

FIG. 20 is a schematic diagram illustrating PCM-PVD used in methods of fabricating a nonvolatile memory device according to some embodiments of the present invention. FIGS. 21 and 22 are graphs illustrating experimental results obtained by depositing an information storage portion using PCM-PVD.

Referring to FIG. 20, when plasma is generated by applying a radio frequency (RF) current to a target, magnets arranged on the target form a point-cusp magnetic field. Therefore, PCM-PVD generates high-density plasma.

The point-cusp magnetic field is formed by the arrangement of the magnets on the target. Here, neighboring magnets are arranged to have opposite polarities, and all magnets are arranged at equal intervals. While such arrangement of the magnets forms a strong magnetic field on the surface of the target, the point-cusp magnetic field does not affect the surface of a substrate. Therefore, in the case of PCM-PVD, the substrate is less damaged by plasma.

Process variables that affect the process of depositing a thin film using PCM-PVD may include, for example, RF power (W) applied to the target to generate plasma, partial pressure (Pa) of an argon gas for generating plasma, and bias power (W) applied to the substrate.

Figure 21:
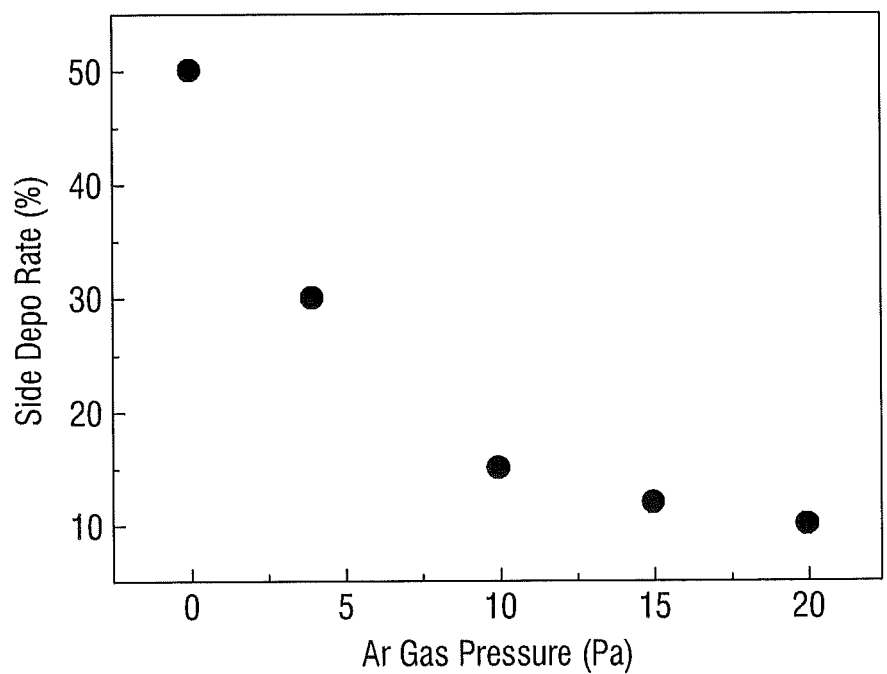
FIGS. 21 and 22 illustrate experimental data obtained by depositing an information storage portion using PCM-PVD.
Figure 22:
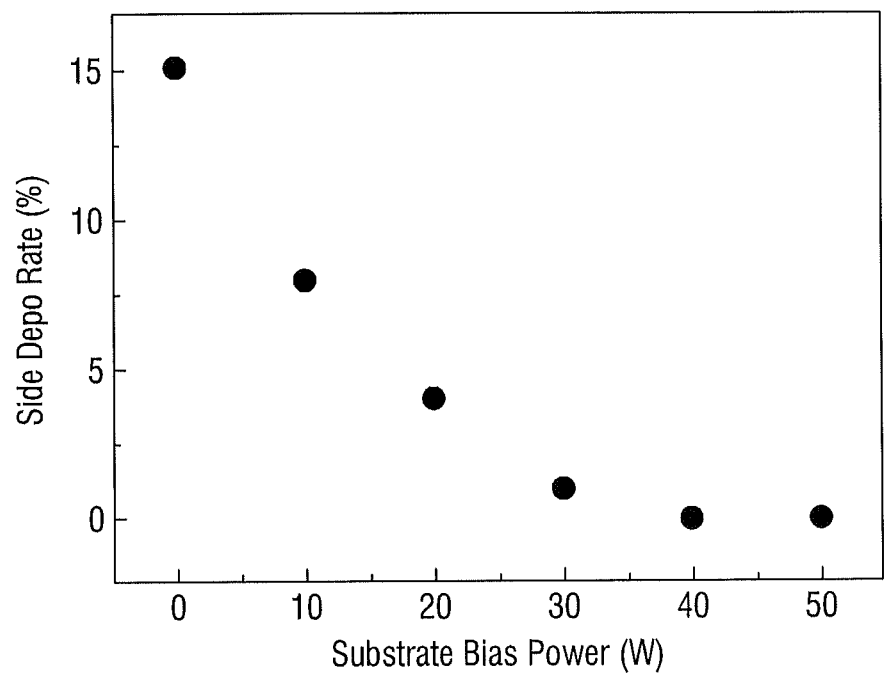

The experimental data of FIGS. 21 and 22 were obtained from experiments conducted after the RF power applied to the target was fixed at the same value.

FIG. 21 illustrates experimental data on the side deposition rate with respect to the partial pressure of the argon gas used as a plasma source.

Referring to FIG. 21, as the partial pressure of the argon gas increases from 0 Pa to 20 Pa, the side deposition rate gradually decreases. As used herein, the term "side deposition rate" denotes a value obtained by multiplying 100 by a value which is obtained by dividing a thickness of a thin film deposited on side surfaces of a protruding structure having a rectangular cross-section by a thickness of a thin film deposited on a top surface of the protruding structure.

When the partial pressure of the argon gas increases, secondary electrons emitted from the target increase plasma density, and the increased plasma density in PCM-PVD leads to a decrease in the side deposition rate.

When a deposition pressure represented by the partial pressure of the argon gas is in a range of 10 to 20 Pa, the side deposition rate is reduced to 15% or less. With such a reduction in the side deposition rate, an etching process for node separation can be easily performed as described above with reference to FIG. 11.

FIG. 22 illustrates experimental data on the side deposition rate with respect to the bias power applied to the substrate. The experimental data of FIG. 22 was obtained from an experiment conducted after the partial pressure of the argon gas used as the plasma source was fixed at 10 Pa.

Referring to FIG. 22, as the bias power applied to the substrate increases from 0 W to 50 W, the side deposition rate gradually decreases. That is, as the bias power applied to the substrate increases from 0 W to 50 W, the side deposition rate decreases from 15% to 0%.

Specifically, when the bias power applied to the substrate is in a range of 20 to 50 W, the side deposition rate is reduced to 5% or less. When the bias power applied to the substrate is 30 W or more, the side deposition rate is nearly 0%. That is, a thin film is formed only on the top surface of the protruding structure and is not formed on the side surfaces of the protruding structure.

Such experimental data is obtained because an increase in the bias power applied to the substrate increases straightness of a deposition material emitted from the target.

In addition, if the experimental data of FIG. 21 is taken into consideration, it can be understood that an increase in the partial pressure of the argon gas from 10 Pa to 20 Pa causes the side deposition rate to be reduced to nearly 0% even if the bias power applied to the substrate is low.

In methods of fabricating a nonvolatile memory device according to embodiments of the present invention, the first and second information storage portions 130 and 135 may be formed when the deposition pressure represented by the partial pressure of the argon gas is in a range of 10 to 20 Pa. In addition, the first and second information storage portions 130 and 135 may be formed by applying a bias power of 10 to 50 W to the substrate.

Figure 14:
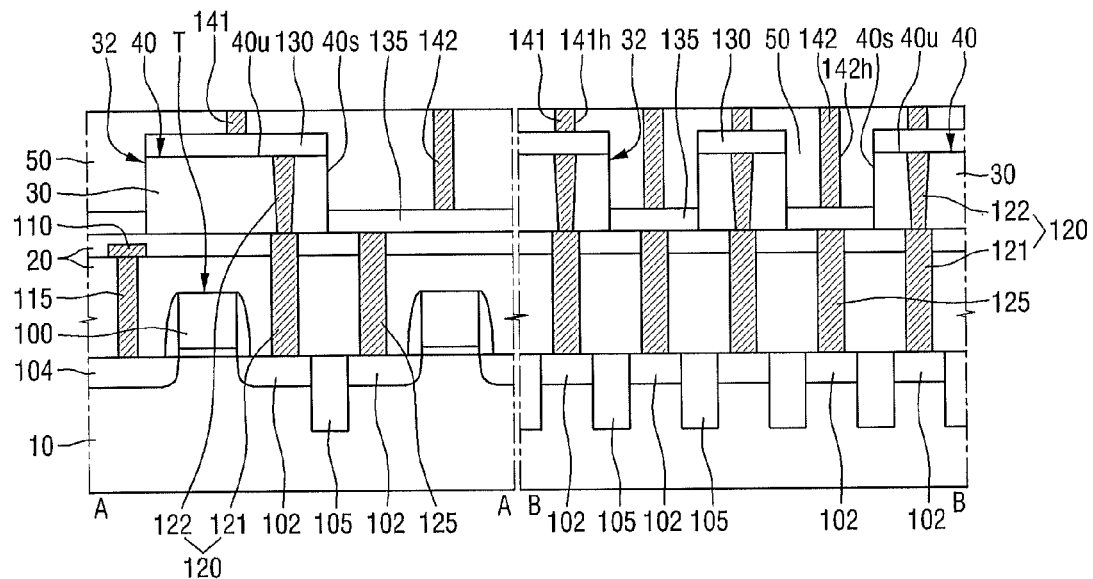

Referring to FIGS. 2 and 14, first wiring contacts 141 are formed on the first information storage portions 130, and second wiring contacts 142 are formed on the second information storage portions 135.

Specifically, a second interlayer insulating film 50 may be formed on the substrate 10 to cover the first information storage portions 130 and the second information storage portions 135. The second interlayer insulating film 50 may include at least one of an oxide layer, a nitride layer and/or an oxynitride layer and may be formed by CVD.

First wiring contact holes 141h and second wiring contact holes 142h are formed to penetrate the second interlayer insulating film 50. The first wiring contact holes 141h and the second wiring contact holes 142h expose the first information storage portions 130 and the second information storage portions 135, respectively. The first wiring contact holes 141h and the second wiring contact holes 142h are filled with a conductive material, and the conductive material is planarized to form the first wiring contacts 141 and the second wiring contacts 142.

Referring to FIGS. 2 and 4, second wiring lines 140 are formed on the first wiring contacts 141 and the second wiring contacts 142 to overlap the first and second information storage portions 130 and 135 arranged along the first direction DR1.

Methods of fabricating a nonvolatile memory device according to some embodiments of the present invention will now be described with reference to FIGS. 2, 5, 9 through 13, and 15. The current embodiments is substantially identical to previously described embodiments except that insulating spacers are formed. Therefore, elements substantially identical to those of the previous embodiments are indicated by like reference numerals, and their description will be simplified or omitted.

Figure 15:
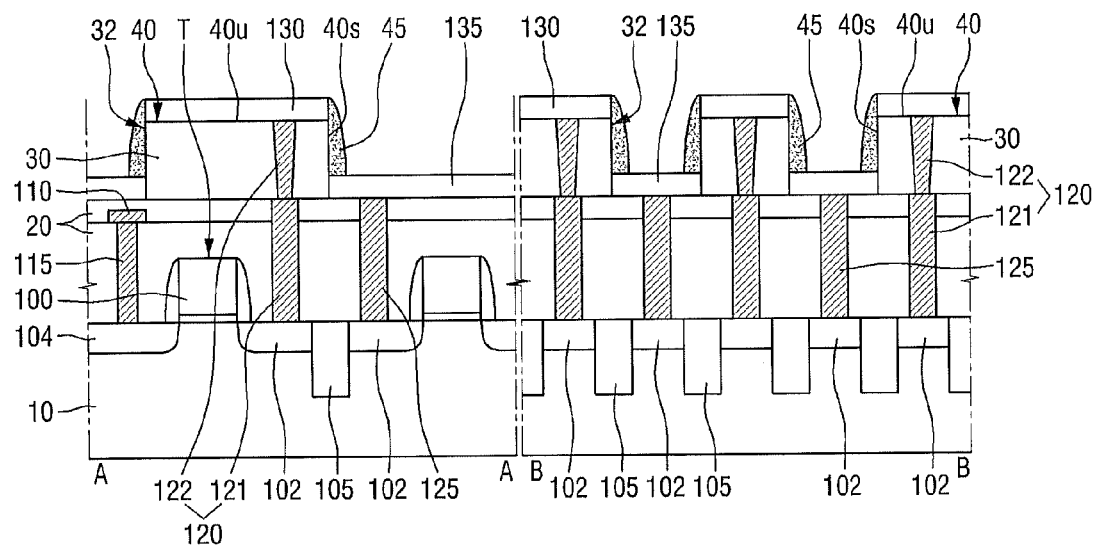
FIG. 15 is a view illustrating operations of methods of fabricating a nonvolatile memory device according to some embodiments of the present invention.

FIG. 15 is a view illustrating operations of methods of fabricating a nonvolatile memory device according to some embodiments of the present invention.

Referring to FIG. 15, insulating spacers 45 may be formed on side surfaces of first information storage portions 130 and side surfaces 40s of protrusions 40.

The insulating spacers 45 are formed on second information storage portions 135 and overlap the second information storage portions 135. Top surfaces of the second information storage portions 135 are partially covered by the insulating spacers 45.

Specifically, an insulating spacer layer is conformally formed on a substrate 10 having the first information storage portions 130 and the second information storage portions 135. The insulating spacer layer may include at least one of an oxide layer, a nitride layer, and/or an oxynitride layer. The insulating spacer layer is etched back to form the insulating spacers 45 on the side surfaces of the first information storage portions 130 and the side surfaces 40s of the protrusions 40.

Referring to FIGS. 2 and 5, second wiring lines 140 are formed on the first and second information storage portions 130 and 135 to overlap the insulating spacers 45 and the first and second information storage portions 130 and 135, which are arranged along the first direction DR1. The second wiring lines 140 may extend along the first direction DR1.

Methods of fabricating a nonvolatile memory device according to some embodiments of the present invention will now be described with reference to FIGS. 2, 6, 9 through 12, 16 and 17.

Figure 16:
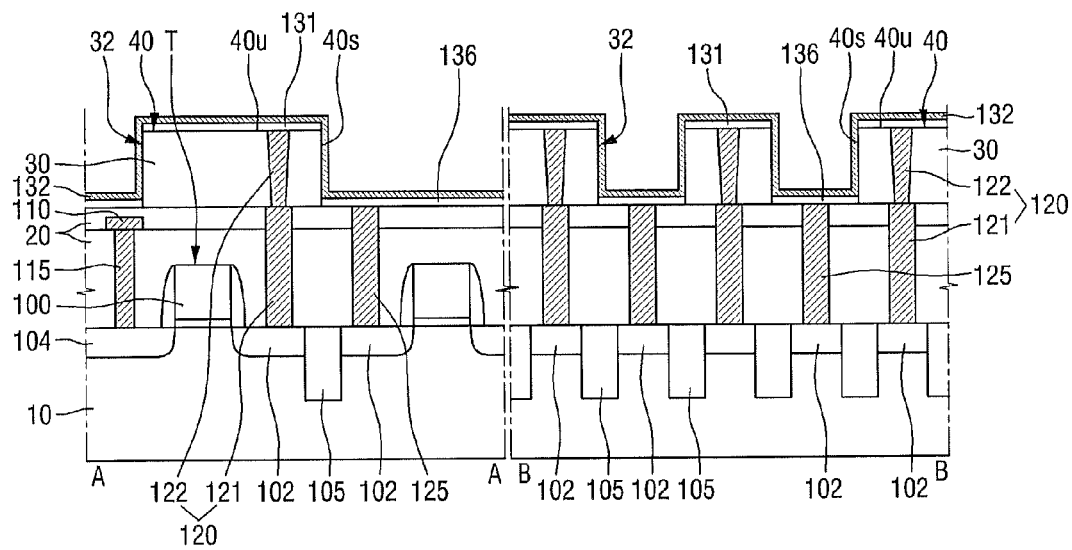
FIGS. 16 and 17 are views illustrating operations of methods of fabricating a nonvolatile memory device according to some embodiments of the present invention.
Figure 17:
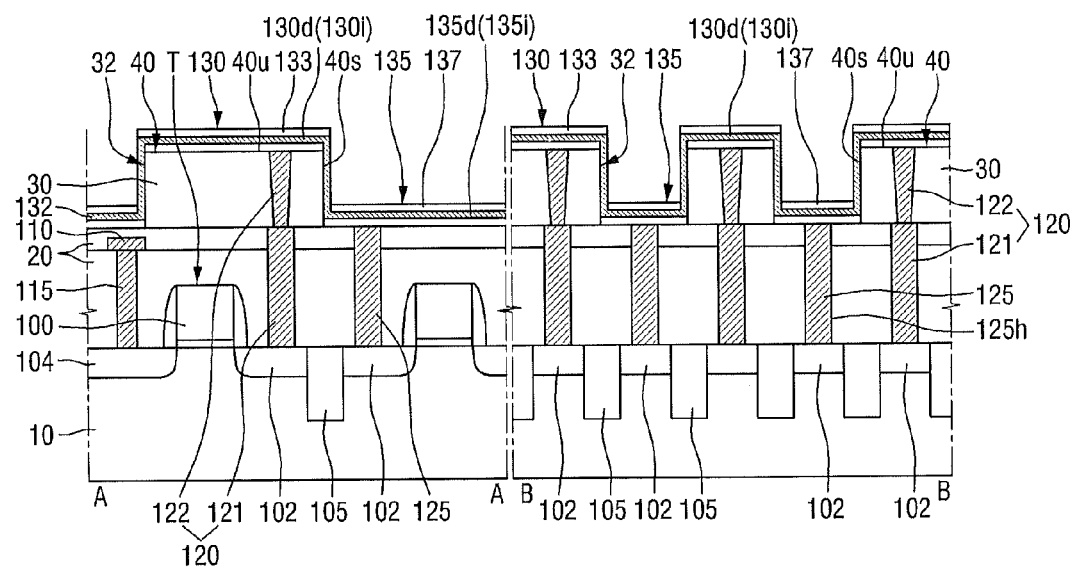

FIGS. 16 and 17 are views illustrating operations of methods of fabricating a nonvolatile memory device according to some embodiments of the present invention.

Referring to FIG. 16, first lower layers 131 and second lower layers 136 are respectively formed on top surfaces 40u of protrusions 40 and bottom surfaces of trenches 32 by using PCM-PVD. Then, a tunneling insulating layer 132 is conformally formed on the protrusions 40 and the trenches 32 to cover the first lower layers 131 and the second lower layers 136.

The tunneling insulating layer 132 is conformally formed on side surfaces of the protrusions 40 on which the first and second lower layers 131 and 136 are not formed. The tunneling insulating layer 132 may be formed by, e.g., atomic layer deposition (ALD).

The first lower layers 131 and the second lower layers 136 may respectively include first bottom electrodes of first information storage portions 130 and second bottom electrodes of second information storage portions 135 described above with reference to FIGS. 7 and 8.

Referring to FIG. 17, first upper layers 133 and second upper layers 137 are formed on the top surfaces 40u of the protrusions 40 and the bottom surfaces of the trenches 32 by using PCM-PVD. Accordingly, the first information storage portions 130 are formed on the top surfaces 40u of the protrusions 40 to be electrically connected to second contacts 120, and the second information storage portions 135 are formed on the bottom surfaces of the trenches 32 to be electrically connected to third contacts 125.

Portions of the tunneling insulating layer 132 which are formed on the top surfaces 40u of the protrusions 40 become first tunnel barrier patterns 130d or 130i of the first information storage portions 130. In addition, portions of the tunneling insulating layer 132 which are formed on the bottom surfaces of the trenches 32 become second tunnel barrier patterns 135d or 135i of the second information storage portions 135.

The first upper layers 133 and the second upper layers 136 may respectively include first top electrodes of the first information storage portions 130 and second top electrodes of the second information storage portions 135 described above with reference to FIGS. 7 and 8.

Since the tunneling insulating layer 132 is formed between the first upper layers 133 and the second lower layers 136, the first upper layers 133 are electrically insulated from the second lower layers 136. That is, the tunneling insulating layer 132 formed on the side surfaces 40s of the protrusions 40 electrically insulates the first upper layers 133 from the second lower layers 136.

Referring to FIGS. 2 and 6, second wiring lines 140 are formed on the first information storage portions 130 and the second information storage portions 135 to overlap the first and second information storage portions 130 and 135 arranged along the first direction DR1.

The first and second information storage portions 130 and 135 arranged along the first direction DR1 and electrically connected to the same second wiring line 140 are electrically insulated from each other by the tunneling insulating layer 132 formed on the side surfaces 40s of the protrusions 40.

Nonvolatile memory devices fabricated according to embodiments of the present invention can be implemented as various forms of semiconductor packages. For example, the nonvolatile memory devices according to some embodiments of the present invention may be packaged using various methods such as Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and/or Wafer-level Processed Stack Package (WSP).

Figure 18:
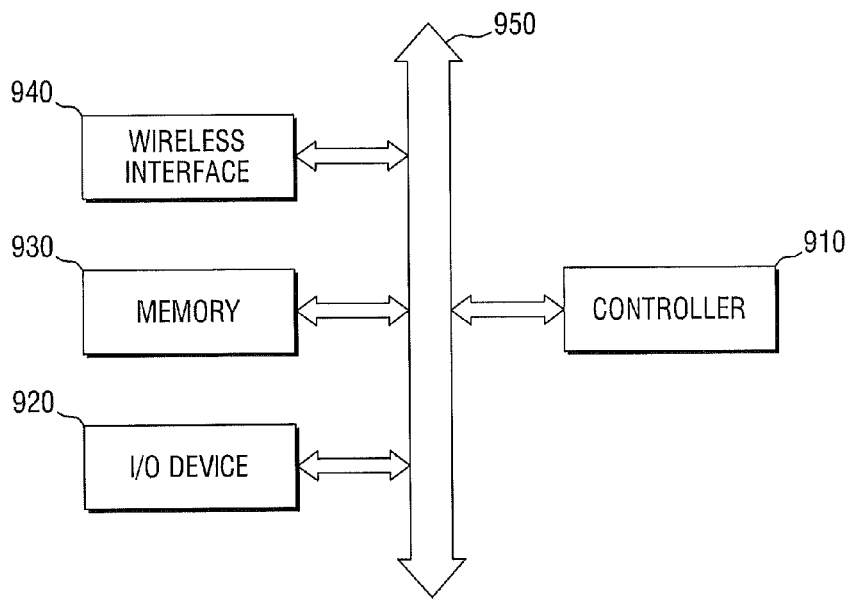
FIG. 18 is a schematic block diagram of a system including a nonvolatile memory device according to some embodiments of the present invention.

FIG. 18 is a schematic block diagram of a system 900 including a nonvolatile memory device according to some embodiments of the present invention.

Referring to FIG. 18, the system 900 according to current embodiments may be used in wireless communication devices, e.g., personal digital assistants (PDAs), laptop computers, portable computers, web tablets, wireless phones, cell phones, digital music players and/or all devices capable of transmitting and/or receiving information in wireless environments.

The system 900 may include a controller 910, an input/output (I/O) device 920 such as a keypad, a keyboard and/or a display, a memory 930, and a wireless interface 940, which are connected to each other through a bus 950. The controller 910 may include at least one microprocessor, a digital signal processor, a microcontroller, and/or other similar devices. The memory 930 may be used to store a command executed by the controller 910. Also, the memory 930 may be used to store user data. The memory 930 may include a nonvolatile memory device according to various embodiments of the present invention. The memory 930 may further include other types of memories, random-accessible volatile memories, and/or various other types of memories.

The system 900 may use the wireless interface 940 to transmit or receive data to or from a wireless communication network using an RF signal. For example, the wireless interface 900 may include an antenna, a wireless transceiver, etc.

The system 900 according to the current embodiment may be used as a communication interface protocol such as, for example, a next-generation communication system, e.g., CDMA (Code Division Multiple Access), GSM (Global System for Mobile communication), NADC (North 20 American Digital Cellular), TDMA (Time Division Multiple Access), ETDMA (Extended TDMA), WCDMA (Wideband CDMA), and/or CDMA-2000, etc. Nonvolatile memory devices fabricated using methods of fabricating a nonvolatile memory device according to embodiments of the present invention can be applied to a memory card, as will be described below with reference to FIG. 19.

Figure 19:
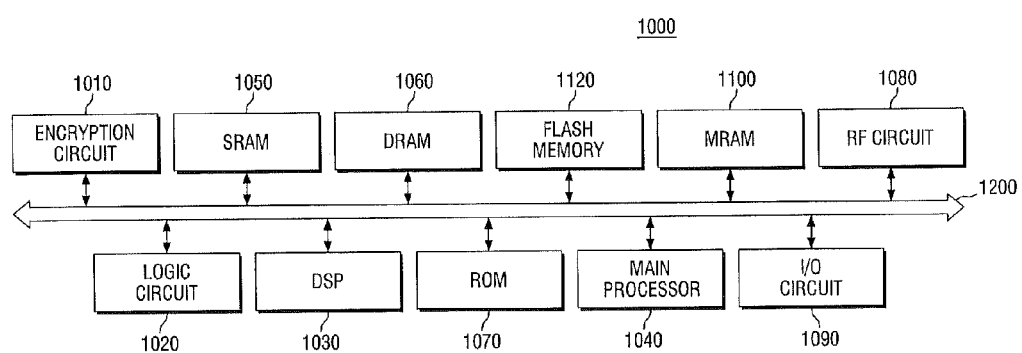
FIG. 19 is a block diagram illustrating the configuration of a memory card to which a nonvolatile memory device according to some embodiments of the present invention is applied.

FIG. 19 is a block diagram illustrating the configuration of a memory card 1000 to which a nonvolatile memory device according to some embodiments of the present invention is applied.

Referring to FIG. 19, the memory card 1000 according to the current embodiment may include an encryption circuit 1010, a logic circuit 1020, a digital signal processor (DSP) 1030 that is a special purpose microprocessor, and a main processor 1040. Also, the memory card 1000 may include a nonvolatile memory device (e.g., MRAM) 1100 according to various embodiments of the present invention and other various types of memories, e.g., an SRAM 1050, a DRAM 1060, a ROM 1070, and a flash memory 1120. In addition, the memory card 1000 may include an RF (high frequency/microwave) circuit 1080 and an I/O circuit 1090. Function blocks 1010 through 1120 included in the memory card 1000 may be connected to each other through a system bus 1200. The memory card 1000 may operate in compliance with the control of an external host, and the nonvolatile memory device 1100 according to an embodiment of the present invention may function to store data or output stored data in compliance with the control of the host.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A nonvolatile memory device comprising:
   a plurality of impurity regions that are formed in a substrate;
   a first contact that is electrically connected to at least one of the impurity regions;
   a second contact that is electrically connected to at least one of the impurity regions;
   a first information storage portion that is formed at a first height from the substrate and electrically connected to the first contact;
   a second information storage portion that is formed at a second height, which is different from the first height, from the substrate and electrically connected to the second contact; and
   an insulating layer pattern that is interposed between the substrate and the first information storage portion and between the substrate and the second information storage portion,
   wherein the insulating layer pattern comprises a protrusion that is defined by a trench formed in the insulating layer pattern,
   wherein the first information storage portion is formed on the protrusion to expose side surfaces of the protrusion, and
   wherein the second information storage portion is formed on a bottom surface of the trench.

2. The nonvolatile memory device of claim 1, wherein the first information storage portion is formed on a top surface of the protrusion and is not formed on the side surfaces of the protrusion.

3. The nonvolatile memory device of claim 1, further comprising a second bit line contact that electrically connects the second information storage portion and a bit line.

4. The nonvolatile memory device of claim 3, further comprising a first bit line contact that electrically connects the first information storage portion and the bit line.

5. The nonvolatile memory device of claim 1, further comprising:
   insulating spacers that are formed on side surfaces of the first information storage portion and the side surfaces of the protrusion; and
   a bit line that is electrically connected to the first information storage portion and the second information storage portion and that fills the trench.

6. The nonvolatile memory device of claim 5, wherein the insulating spacers overlap the second information storage portion.

7. The nonvolatile memory device of claim 1, further comprising a tunneling insulating layer that is conformally formed on the insulating layer pattern,
   wherein the insulating layer pattern comprises the protrusion and the trench.

8. The nonvolatile memory device of claim 7,
   wherein the first information storage portion and the second information storage portion respectively comprise a first tunnel barrier pattern and a second tunnel barrier pattern,
   wherein the tunneling insulating layer formed on the top surface of the protrusion is the first tunnel barrier pattern, and
   wherein the tunneling insulating layer formed on the bottom surface of the trench is the second tunnel barrier pattern.

9. The nonvolatile memory device of claim 7, further comprising a bit line that is electrically connected to the first information storage portion and the second information storage portion and that fills the trench,
   wherein the tunneling insulating layer is disposed between the bit line and the insulating layer pattern.

10. The nonvolatile memory device of claim 1,
    wherein the first contact comprises a first lower contact and a first upper contact,
    wherein the first upper contact is on the first lower contact, and
    wherein the first lower contact is at the same level as the second contact.

11. The nonvolatile memory device of claim 1, wherein the protrusion is shaped like an inverted quadrangular pyramid.

12. The nonvolatile memory device of claim 1, wherein each of the first information storage portion and the second information storage portion comprises a magnetic tunnel junction.

13. A nonvolatile memory device comprising:
    a plurality of first information storage portions that are at a first height from a substrate and separated from each other along a first direction and a second direction that is different from the first direction; and a plurality of second information storage portions formed at a second height from the substrate and that is different from the first height, the plurality of second information storage portions being arranged between the first information storage portions that are separated from each other, wherein each of the first and second information storage portions comprises a magnetic tunnel junction, wherein the first information storage portions are on a protrusion that is defined by a trench, and wherein the second information storage portions are on a bottom surface of the trench.

14. The nonvolatile memory device of claim 13, wherein the first information storage portions and the second information storage portions are alternately arranged along the first direction and the second direction.

15. A nonvolatile memory device comprising:
a first information storage portion that includes a first magnetic tunnel junction and that is at a first height from a substrate;
a second information storage portion that includes a second magnetic tunnel junction and that is at a second height from the substrate, the second height being different from the first height; and
an insulating layer pattern that is interposed between the first information storage portion and the substrate and between the second information storage portion and the substrate,
wherein the insulating layer pattern comprises a protrusion defined by a trench in the insulating layer pattern,
wherein the first information storage portion is on the protrusion, and
wherein the second information storage portion is on a bottom surface of the trench.

16. The nonvolatile memory device of claim 15, wherein the first information storage portion is on a top surface of the protrusion and is not on the side surfaces of the protrusion.

17. The nonvolatile memory device of claim 15, further comprising:
insulating spacers which are on side surfaces of the first information storage portion and the side surfaces of the protrusion; and
a bit line which is electrically connected to the first information storage portion and the second information storage portion and fills the trench.

18. The nonvolatile memory device of claim 15, wherein the protrusion is shaped like an inverted quadrangular pyramid.

19. The nonvolatile memory device of claim 15, further comprising:
a first bit line contact that electrically connects the first information storage portion and a bit line; and
a second bit line contact that electrically connects the second information storage portion and the bit line.

20. The nonvolatile memory device of claim 15, further comprising a tunneling insulating layer conformally formed on the insulating layer pattern that includes the protrusion and the trench.

21. The nonvolatile memory device of claim 15, further comprising:
a first contact that is electrically connected to at least one of a plurality of impurity regions in the substrate and to the first information storage portion;
a second contact that is electrically connected to at least one of the plurality of impurity regions in the substrate and to the second information storage portion,
wherein the first contact comprises a first lower contact and a first upper contact,
wherein the first upper contact is on the first lower contact, and
wherein the first lower contact is at the same level as the second contact.

* * * * *